United States Patent
Ookura et al.

(10) Patent No.: US 7,755,003 B2
(45) Date of Patent: Jul. 13, 2010

(54) TEMPERATURE CONTROL FOR PERFORMING HEAT PROCESS ON RESIST FILM

(75) Inventors: Jun Ookura, Koshi (JP); Eiichi Sekimoto, Koshi (JP); Hisakazu Nakayama, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 215 days.

(21) Appl. No.: 11/965,093

(22) Filed: Dec. 27, 2007

(65) Prior Publication Data
US 2008/0156785 A1    Jul. 3, 2008

(30) Foreign Application Priority Data
Dec. 28, 2006    (JP) .............................. 2006-354776

(51) Int. Cl.
C21D 1/40 (2006.01)
H05B 3/68 (2006.01)
H05B 1/02 (2006.01)

(52) U.S. Cl. ..................... 219/162; 219/444.1; 219/494

(58) Field of Classification Search ... 219/443.1–468.2, 219/482–494, 162; 118/724–728; 432/253, 432/258
See application file for complete search history.

(56) References Cited

U.S. PATENT DOCUMENTS
7,536,230 B2 * 5/2009 Nanno et al. .................. 700/30

FOREIGN PATENT DOCUMENTS
JP    11-67619    3/1999

* cited by examiner

*Primary Examiner*—Sang Y Paik
(74) *Attorney, Agent, or Firm*—Oblon, Spivak, McClelland, Maier & Neustadt, L.L.P.

(57) ABSTRACT

A temperature control method for a heat process on a resist film on a substrate includes first and second steps. The first step includes measuring a stepped response waveform of measured temperatures of a substrate at measurement points while changing stepwise each target temperature, then using this result to compose a pulsed response waveform with respect to a change of a pulsed target temperature, then using this result to compose a triangular response waveform with respect to a change of a triangular target temperature, and then using this result to acquire a matrix as relation information showing a relation between the target temperatures and temperatures of the substrate at measurement points. The second step includes acquiring temperature distribution information by use of measured temperatures of the substrate placed on the hot plate, measured at measurement points before adjustment of the target temperatures, and then calculating adjustment information by use of the relation information acquired in the first step and the temperature distribution information, thereby determining adjustment information.

17 Claims, 23 Drawing Sheets

$$\begin{matrix} & \text{ch1} & \text{ch2} & --- & \text{chp} \\ \text{Measurement point 1} \\ \text{Measurement point 2} \\ \text{Measurement point 3} \\ \vdots \\ \text{Measurement point k} \end{matrix} \begin{bmatrix} 0.12(a_{11}) & 0.03(a_{12}) & --- & 0.01(a_{1p}) \\ 0.21(a_{21}) & 0.08(a_{22}) & --- & 0.02(a_{2p}) \\ 0.35(a_{31}) & 0.15(a_{32}) & --- & 0.04(a_{3p}) \\ \vdots & \vdots & \vdots & \vdots \\ 0.01(a_{k1}) & 0.02(a_{k2}) & --- & 0.01(a_{kp}) \end{bmatrix}$$
FIG. 16
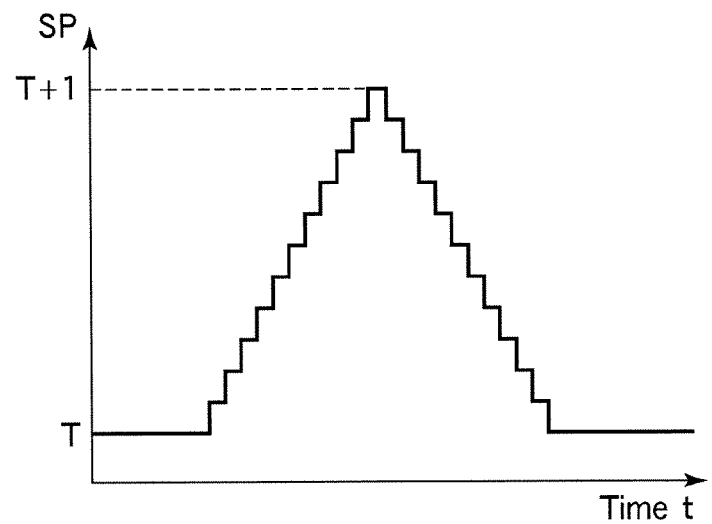
FIG. 17
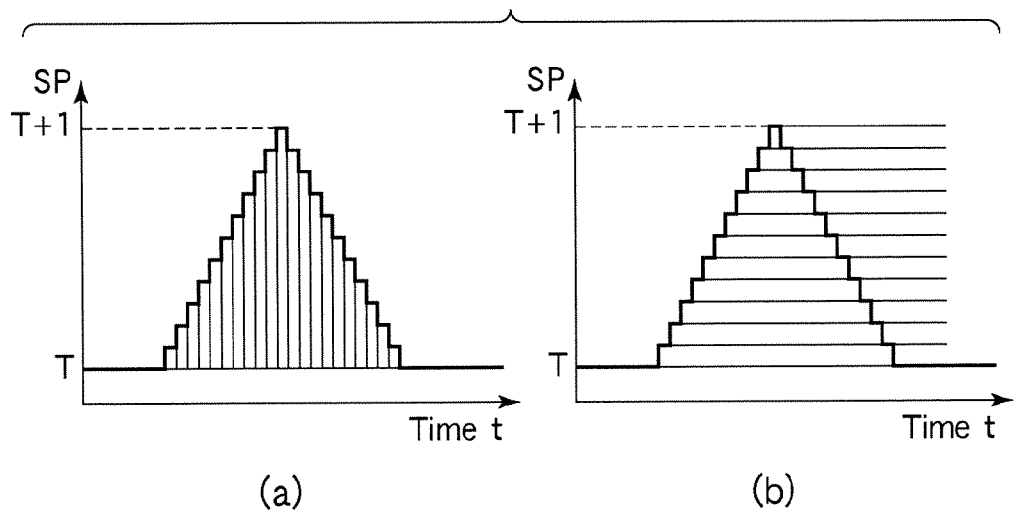
(a)            (b)
FIG. 18

FIG. 19

$$A = \begin{matrix} & 1 & 2 & \cdots & n \\ t1 & A_{11} & A_{12} & \cdots & A_{1n} \\ t2 & A_{21} & A_{22} & \cdots & A_{2n} \\ \vdots & \vdots & \vdots & \ddots & \vdots \\ tm & A_{m1} & A_{m2} & \cdots & A_{mn} \end{matrix}$$

FIG. 20

$$A_{21} = \begin{matrix} & ch1 & ch2 & \cdots & chp \\ s1 & a_{11} & a_{12} & \cdots & a_{1p} \\ s2 & a_{21} & a_{22} & \cdots & a_{2p} \\ \vdots & \vdots & \vdots & \ddots & \vdots \\ sk & a_{k1} & a_{k2} & \cdots & a_{kp} \end{matrix}$$

FIG. 21

TEMPERATURE CONTROL FOR PERFORMING HEAT PROCESS ON RESIST FILM

BACKGROUND OF THE INVENTION

1. Field of the Invention

The present invention relates to a temperature control method for controlling the temperature of a hot plate, so that respective measured temperatures of the hot plate at a plurality of measurement points conform to respective target temperatures. This method is adopted in a heat processing apparatus for performing a heat process on a substrate placed on a hot plate, which is used in a coating/developing system for applying a resist coating onto a substrate, such as a semiconductor wafer, to form a resist film and then performing development on the resist film after light exposure. The present invention further relates to an adjusting apparatus, a temperature controller, a program, a storage medium, and a heat processing apparatus, which are suitably compatible with the temperature control method. Particularly, the present invention relates to a suitable technique for suppressing a variation in temperature during a transient time.

2. Description of the Related Art

In the sequence of photolithography for semiconductor devices, a resist is applied onto a semiconductor wafer to form a resist film. Then, the resist film is subjected to a light exposure process in accordance with a predetermined circuit pattern. Then, the light-exposed pattern thus formed is subjected to a developing process to form a circuit pattern on the resist film. During this sequence, various heat processes are performed, such as a heat process (pre-baking) after resist coating, a heat process (post-exposure-baking) after light exposure, and a heat process (post-baking) after development.

The resist coating, the development after light exposure, and the heat processes described above are preformed by a resist coating/developing system which includes a plurality of processing units for performing these processes and transfer units for sequentially transferring wafers to perform a series of processes.

In general, a heat processing unit for performing a heat process in this coating/developing system is structured to perform a heat process on a target substrate, such as a semiconductor wafer, placed on a hot plate, which is provided with a heater and a temperature sensor built therein to control the temperature to be a target temperature (for example, Jpn. Pat. Appln. KOKAI Publication 11-067619).

Conventionally, in a heat processing unit of this type, the temperature of the hot plate is controlled to be uniform, so as to uniformly perform a heat process without a variation on a circular semiconductor wafer by the hot plate. However, for example, in a transient time when the semiconductor wafer is placed on the hot plate and the heat process is started, even if the temperature of the hot plate is uniformly controlled, the temperature of the semiconductor wafer is not equal to the temperature of the hot plate. Further, the semiconductor wafer tends to release heat more at the peripheral portion than at the central portion on the surface, and a variation in temperature is generated on the surface of the semiconductor wafer. In addition, a number of heat processing units are disposed in one resist coating/developing system, and include individual differences among them, so the temperature of substrates heated by heat processing units suffer a variation in temperature depending on the units.

As described above, conventionally, even if the temperature of a hot plate is controlled to be in a desired state, the temperature of the semiconductor wafer can be hardly set in a desired temperature state.

BRIEF SUMMARY OF THE INVENTION

An object of the present invention is to provide a temperature control method that can control a substrate, such as a semiconductor wafer, to be in a desired temperature state. Another object of the present invention is to provide an adjusting apparatus, a temperature controller, a program, a storage medium, and a heat processing apparatus, which are suitably compatible with the temperature control method.

According to a first aspect of the present invention, there is provided a temperature control method for controlling a temperature of a hot plate, so that respective measured temperatures of the hot plate at a plurality of measurement points conform to respective target temperatures, in a heat processing apparatus for performing a heat process on a substrate placed on the hot plate, which is used in a coating/developing system for applying a resist coating onto the substrate to form a resist film and then performing development on the resist film after light exposure, the method comprising: a first step of measuring a stepped response waveform of measured temperatures of a substrate at the plurality of measurement points while changing stepwise each target temperature, then using the measured stepped response waveform to compose a pulsed response waveform with respect to a change of a pulsed target temperature, then using the pulsed response waveform to compose a triangular response waveform with respect to a change of a triangular target temperature, and then using the triangular response waveform to acquire a matrix as relation information showing a relation between the target temperatures and temperatures of the substrate at the plurality of measurement points; a second step of acquiring temperature distribution information by use of measured temperatures of the substrate placed on the hot plate, measured at the plurality of measurement points before adjustment of the target temperatures, and then calculating adjustment information by use of the relation information acquired in the first step and the temperature distribution information, thereby determining adjustment information; and a third step of adjusting the target temperatures by use of the adjustment information acquired in the second step.

The relation information means information showing a relation between the target temperatures and temperatures of the substrate, and it is preferable that one of each target temperature and the temperature of the substrate can predict the other by the relation information. The relation information is preferably shows a transient input and output relation from the target temperatures to the temperatures of the substrate, such as a matrix showing an interference degree, transfer function, or state spatial expression.

In addition, the adjustment of the target temperature can be applied to either state of a transient state or a steady state. The adjustment of the temperature may be performed only when it is necessary, when the target temperature is reset or at the transient time, for example.

The term "before adjustment" means a state before the target temperature is adjusted by use of the relation information, that is, before the adjustment according to the present invention, so that it means the same control state as a conventional state.

The temperature distribution information means information showing a distribution of the temperature of the substrate, such as the temperatures at respective positions of the substrate or the temperature differences from a reference temperature at respective positions the substrate. For example, the temperature distribution of the substrate before adjustment, such as a variation in temperature of the substrate, can be grasped from this temperature distribution information. The temperature distribution information of the substrate before the target temperature is adjusted can be acquired as a previously measured temperature of the substrate in a past process.

The adjustment information means information used for adjusting the target temperature, which may be a value of the target temperature after adjusted itself, or may be a value of the temperature to be added to or subtracted from the target temperature before adjustment as a reference. This adjustment information may be values of the temperatures at a plurality of time points during a period required to adjust the target temperature, or time-series temperature data for that period. Alternatively, it may be a transfer function corresponding to the time-series temperature data.

A plurality of measurement points of the substrate are preferably positions (portions) in which the temperature is to be controlled to a desired temperature in the substrate, such as positions in which the variation in temperature is to be prevented. The variation means a variation from the average value measured from the plurality of measurement points or a variation from a reference temperature detected at the reference measurement point, for example.

The composition of the pulsed response waveform means that the pulsed response waveform is calculated based on actually measured stepped response waveform by use of a principle of overlapping. By this composition, the response waveform with respect to the input waveforms of the various kinds of target temperatures can be acquired.

In the first aspect, the method may comprise the first step arranged to use a test substrate in measuring the stepped response waveform for composing the pulsed response waveform, and then using the pulsed response waveform to acquire relation information showing a relation between the target temperatures and temperatures of the test substrate at the plurality of measurement points; the second step arranged to acquire temperature distribution information by use of measured temperatures of the test substrate, measured at the plurality of measurement points before adjustment of the target temperatures, and then determine adjustment information by use of the relation information acquired in the first step and the temperature distribution information; and the third step arranged to adjust the target temperatures by use of the adjustment information acquired in the second step. Thus, the temperatures of a substrate at the plurality of measurement points can be adjusted to a desired temperature, so that the variation in temperature at the plurality of measurement points can be decreased.

In the first aspect, the first step may be arranged to compose a plurality of temporally different pulsed response waveforms.

The plurality of temporally different pulsed response waveforms mean a plurality of response waveforms of the substrate at the plurality of measurement points respectively corresponding to the changes of the plurality of target temperatures having time difference. The matrix preferably shows temperature changes of the substrate at the plurality of measurement points with respect to the changes of the plurality of target temperatures.

According to this constitution, since the plurality of temporally different pulsed response waveforms are used to compose triangular response waveform to find a matrix as the relation information, the matrix is provided in view of the temporal interference, so that the temperature of the substrate can be controlled to be a desired temperature state with high precision by use of such matrix. The desirable temperature state means a uniform temperature state in which a variation in temperature, for example, due to the position of the substrate is decreased, or a desirable temperature distribution is provided.

In the first aspect, the adjustment information may comprise an adjustment value at a preset time point for each of the plurality of target temperatures, and the second step may be arranged to calculate the adjustment value by use of an inverse matrix of the matrix and the temperature distribution information.

The preset time point is preferably a time point in which the substrate is to be controlled at a desired temperature, and preferable comprises a plurality of time points. Each time point is set based on a reference time point, a time point the treatment of the substrate is started, for example. The inverse matrix may be a pseudo-inverse matrix. The adjustment value may be calculated by solving a simultaneous equation without use of the inverse matrix.

According to this constitution, the adjustment value required to eliminate the shift of the temperature can be calculated in accordance with the preset time point by use of the inverse matrix from the temperature distribution information corresponding to the shift of the temperature from a desired temperature state. Thus, when the target temperature is adjusted according to this adjustment value, the shift of the temperature of the substrate at the preset time point can be eliminated and becomes the desired temperature state.

In the first aspect, the second step may be arranged to randomly change at least the adjustment value and search for an optimal value of the adjustment value by a searching method using an evaluation formula including the matrix.

The searching method may be a genetic algorithm, a simulated annealing (SA) method and the like. In addition, in searching for the optimal value, the calculated adjustment value may be set to an initial value and an optimal value of the adjustment value may be searched for by the genetic algorithm using the evaluation formula including the matrix.

According to this constitution, the optimal value of the adjustment value is searched for by the searching method such as the genetic algorithm. Thus, when the target temperature is adjusted by use of the adjustment value thus determined, the temperature of the substrate can be controlled so as to be a desired temperature state with high precision.

In the first aspect, the second step may be arranged to determine the adjustment information by repeating a plurality of times an operation for acquiring the temperature distribution information and an operation for calculating adjustment information by use of the relation information acquired in the first step and the temperature distribution information.

Where the adjustment information is determined by repeating these operations, the adjustment information can be acquired with high precision. In this case, the second step may be arranged to perform the operation for calculating adjustment information a plurality of times respectively at different time points.

The second step may be arranged to perform one time or a plurality of times a temperature stabilization operation for stabilizing temperature of the substrate placed on the hot plate prior to an operation for calculating adjustment information.

With this arrangement, the temperature stability in the operation for calculating adjustment information is improved, so that the adjustment information can be acquired with high precision.

The second step may be arranged to perform the temperature stabilization operation along with an offset adjustment of the target temperatures in light of the temperature difference between the surface of the substrate and the target temperatures. In this case, the adjustment time can be shortened.

According to a second aspect of the present invention, there is provided an adjusting apparatus for acquiring adjustment information used for a temperature controller configured to control a temperature of a hot plate, so that respective measured temperatures of the hot plate at a plurality of measurement points conform to respective target temperatures, and to adjust the respective target temperatures by use of the adjustment information, in a heat processing apparatus for performing a heat process on a substrate placed on the hot plate, which is used in a coating/developing system for applying a resist coating onto the substrate to form a resist film and then performing development on the resist film after light exposure, the adjusting apparatus comprising: a calculating device configured to calculate the adjustment information for adjusting temperature of a substrate to a desired temperature state, by use of relation information showing a relation between the target temperatures and temperatures of the substrate and temperature distribution information of the substrate measured before adjustment of the target temperatures, wherein the calculating device comprises a first calculating portion for measuring a stepped response waveform of measured temperatures of the substrate at the plurality of measurement points while changing stepwise each target temperature, then using the measured stepped response waveform to compose a pulsed response waveform with respect to a change of a pulsed target temperature, then using the pulsed response waveform to compose a triangular response waveform with respect to a change of a triangular target temperature, and then using the triangular response waveform to acquire a matrix as relation information showing a relation between the target temperatures and temperatures of the substrate at the plurality of measurement points, and a second calculating portion for calculating the temperature distribution information by use of measured temperatures of the substrate measured at the plurality of measurement points before adjustment of the target temperatures.

The relation information may be stored in a storage portion of the adjusting apparatus. Alternatively, the relation information stored in an external memory device may be read and used. Alternatively, the relation information may be calculated by use of the measured data. It is preferable that the adjusting apparatus and the temperature controller are connected wirelessly or through a wire, so that the adjustment information calculated by the calculating device is transmitted to the temperature controller.

Data of measured temperatures of the substrate at the plurality of measurement points when the target temperature is changed or measured temperatures measured of the substrate at the plurality of measurement points before adjustment of the target temperature may be data previously measured and stored in a file and the like, or may be data of the measured temperature acquired by a measuring device, such as a temperature logger, connected to the adjusting apparatus.

According to the second aspect, only by measuring the stepped response waveform of the measured temperatures of the substrate at the plurality of measurement points while changing stepwise each target temperature, the pulsed response waveform at the plurality of measurement points when the target temperature is changed into the form of a pulse can be composed in the first calculating portion. Thus, the relation information showing the detailed relation between the target temperatures and temperatures of the substrate at the plurality of measurement points can be acquired by use of the response waveform, and the adjustment information can be calculated by use of the measured temperatures of the substrate at the plurality of measurement points before adjustment, in the second calculating portion.

In the second aspect, the first calculating portion may be arranged to compose a plurality of temporally different pulsed response waveforms. The adjustment information may comprise an adjustment value at a preset time point for each of the plurality of target temperatures, and the calculating device may be arranged to calculate the adjustment value by use of an inverse matrix of the matrix and the temperature distribution information. The calculating device may be arranged to randomly change at least the adjustment value and search for an optimal value of the adjustment value by a searching method using an evaluation formula including the matrix.

According to a third aspect of the present invention, there is provided an adjusting apparatus for acquiring adjustment information used for a temperature controller configured to control a temperature of a hot plate, so that respective measured temperatures of the hot plate at a plurality of measurement points conform to respective target temperatures, and to adjust the respective target temperatures by use of the adjustment information, in a heat processing apparatus for performing a heat process on a substrate placed on the hot plate, which is used in a coating/developing system for applying a resist coating onto the substrate to form a resist film and then performing development on the resist film after light exposure, the adjusting apparatus comprising: a calculating device configured to calculate the adjustment information for adjusting temperature of a substrate to a desired temperature state, by use of measured temperatures of the substrate measured at the plurality of measurement points while changing the target temperatures and measured temperatures of the substrate measured at the plurality of measurement points before adjustment of the target temperature, wherein the calculating device comprises a first calculating portion for measuring a stepped response waveform of measured temperatures of the substrate at the plurality of measurement points while changing stepwise each target temperature, then using the measured stepped response waveform to compose a pulsed response waveform with respect to a change of a pulsed target temperature, then using the pulsed response waveform to compose a triangular response waveform with respect to a change of a triangular target temperature, and then using the triangular response waveform to acquire a matrix as relation information showing a relation between the target temperatures and temperatures of the substrate at the plurality of measurement points, and a second calculating portion for calculating the temperature distribution information by use of measured temperatures of the substrate measured at the plurality of measurement points before adjustment of the target temperatures.

According to the third aspect, the target temperature adjustment information for bringing the substrate to a desired temperature state is calculated by use of the measured temperatures of the substrate at the plurality of measurement points when the target temperature is changed and the measured temperatures of the substrate at the plurality of measurement points before adjustment of the target temperature. Thus, when the adjustment information is applied to the temperature controller and the temperature controller controls the temperature of the hot plate by adjusting the target temperature in accordance with the adjustment information, the substrate can be processes in the desired temperature state.

In the second and third aspects, the desired temperature state is preferably a state in which a variation in measured temperatures of the substrate at the plurality of measurement points is decreased. The variation prevented state means a state in which a variation is decreased as compared with a state before the target temperature is adjusted or a conventional state. The temperature controller may be configured to control the temperature by use of deviation between each target temperature and detected temperature, and adjust at least one of each target temperature and detected temperature in accordance with the adjustment information.

Where the temperature controller controls to decrease a deviation between the target temperature and the detected temperature, the detected temperature may be adjusted instead of the target temperature, to provide the same effect where the target temperature is adjusted, or both of the target temperature and detected temperature may be adjusted to provide the same effect.

According to a fourth aspect of the present invention, there is provided a temperature controller for controlling a temperature of a processing device of a substrate, so that respective measured temperatures of the processing device at a plurality of measurement points conform to respective target temperatures, wherein the temperature controller is configured to adjust the respective target temperatures by use of adjustment information acquired by an adjusting apparatus according to the present invention.

This temperature controller is preferably configured to receive the adjustment information from the adjusting apparatus through a network, and store the adjustment information in a storage portion disposed therein.

According to the fourth aspect, the target temperature is adjusted in accordance with the adjustment information, so that the substrate can be processed in a desired temperature state.

According a fifth aspect of the present invention, there is provided a temperature controller for controlling a temperature of a hot plate, so that respective measured temperatures of the hot plate at a plurality of measurement points conform to respective target temperatures, in a heat processing apparatus for performing a heat process on a substrate placed on the hot plate, which is used in a coating/developing system for applying a resist coating onto the substrate to form a resist film and then performing development on the resist film after light exposure, the temperature controller comprising: a calculating device configured to calculate adjustment information for adjusting temperature of a substrate to a desired temperature state, by use of relation information showing a relation between the target temperatures and temperatures of the substrate, wherein the calculating device comprises a first calculating portion for measuring a stepped response waveform of measured temperatures of the substrate at the plurality of measurement points while changing stepwise each target temperature, then using the measured stepped response waveform to compose a pulsed response waveform with respect to a change of a pulsed target temperature, then using the pulsed response waveform to compose a triangular response waveform with respect to a change of a triangular target temperature, and then using the triangular response waveform to acquire a matrix as relation information showing a relation between the target temperatures and temperatures of the substrate at the plurality of measurement points, and a second calculating portion for calculating the temperature distribution information by use of measured temperatures of the substrate measured at the plurality of measurement points before adjustment of the target temperatures.

In the fifth aspect, the target temperature adjustment information for bringing the substrate to a desired temperature state is calculated by use of the relation information. The temperature of the hot plate is controlled by adjusting target temperature in accordance with this adjustment information, so the substrate can be controlled in the desired temperature state.

According to a sixth aspect of the present invention, there is provided a program for acquiring adjustment information used for a temperature controller configured to control a temperature of a hot plate, so that respective measured temperatures of the hot plate at a plurality of measurement points conform to respective target temperatures, and to adjust the respective target temperatures by use of the adjustment information, in a heat processing apparatus for performing a heat process on a substrate placed on the hot plate, which is used in a coating/developing system for applying a resist coating onto the substrate to form a resist film and then performing development on the resist film after light exposure, wherein the program causes a computer to execute: a first procedure of using a stepped response waveform of measured temperatures of a substrate, measured at the plurality of measurement points while changing stepwise each target temperature, to compose a pulsed response waveform with respect to a change of a pulsed target temperature, then using the pulsed response waveform to compose a triangular response waveform with respect to a change of a triangular target temperature, and then using the triangular response waveform to acquire a matrix as relation information showing a relation between the target temperatures and temperatures of the substrate at the plurality of measurement points, and a second procedure of calculating temperature distribution information by use of measured temperatures of the substrate measured at the plurality of measurement points before adjustment of the target temperatures, and then calculating adjustment information for adjusting temperature of the substrate to a desired temperature state, by use of the relation information acquired in the first procedure and the temperature distribution information.

According to the sixth aspect, the program is executed by the computer, so that the first procedure is arranged to calculate the relation information showing the relation between the target temperatures and temperatures of the substrate, and the second procedure is arranged to calculate the adjustment information for adjusting the temperature of the substrate to the desired temperature state, by use of the relation information and the temperature distribution information of the substrate before adjustment. Thus, when the adjustment information is applied to the temperature controller and the temperature controller controls the temperature of the hot plate by adjusting the target temperature in accordance with the adjustment information, the substrate can be processed in a desired temperature state.

In the sixth aspect, the first procedure may be arranged to compose a plurality of temporally different pulsed response waveforms. The adjustment information may comprise an adjustment value at a preset time point for each of the plurality of target temperatures, and the second procedure may be arranged to calculate the adjustment value by use of an inverse matrix of the matrix and the temperature distribution information. The second procedure may be arranged to randomly change at least the adjustment value and search for an optimal value of the adjustment value by a searching method using an evaluation formula including the matrix.

In the sixth aspect, the second procedure may be arranged to determine the adjustment information by repeating a plurality of times an operation for acquiring the temperature distribution information and an operation for calculating adjustment information by use of the relation information acquired in the first procedure and the temperature distribution information. In this case, the second procedure is arranged to perform the operation for calculating adjustment information a plurality of times respectively at different time points.

In the sixth aspect, the second procedure may be arranged to perform one time or a plurality of times a temperature stabilization operation for stabilizing temperature of the substrate placed on the hot plate prior to an operation for calculating adjustment information. In this case, the second procedure may be arranged to perform the temperature stabilization operation along with an offset adjustment of the target temperatures that comprise steady temperatures.

According to a seventh aspect of the present invention, there is provided a computer readable storage medium that stores the program described above.

As the storage medium, a flexible disk, hard disk, optical disk, magnetic optical disk, CD-ROM, magnetic tape, non-volatile memory car, or ROM may be used, for example.

According to an eighth aspect of the present invention, there is provided a heat processing apparatus for performing a heat process on a substrate, which is used in a coating/developing system for applying a resist coating onto the substrate to form a resist film and then performing development on the resist film after light exposure, the heat processing apparatus comprising: a hot plate configured to heat a substrate placed thereon, the temperature controller described above, an operating device configured to heat the hot plate in accordance with an output of the temperature controller, and a temperature detecting device configured to detect temperature of the hot plate at a plurality of detection points.

Additional objects and advantages of the invention will be set forth in the description which follows, and in part will be obvious from the description, or may be learned by practice of the invention. The objects and advantages of the invention may be realized and acquired by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 16 is a view showing an example of an interference matrix;

FIG. 17 is a view showing an input of a triangular waveform;

FIG. 18 is a view showing composition of the triangular input shown in FIG. 17 for purposes of illustration;

FIG. 19 is a view showing a detailed constitution of the interference matrix;

FIG. 20 is a view showing a constitution of the interference matrix;

FIG. 21 is a view showing a matrix of a part of the interference matrix shown in FIG. 20;

DETAILED DESCRIPTION OF THE INVENTION

An embodiment of the present invention will now be described with reference to the accompanying drawings.

Figure 1:
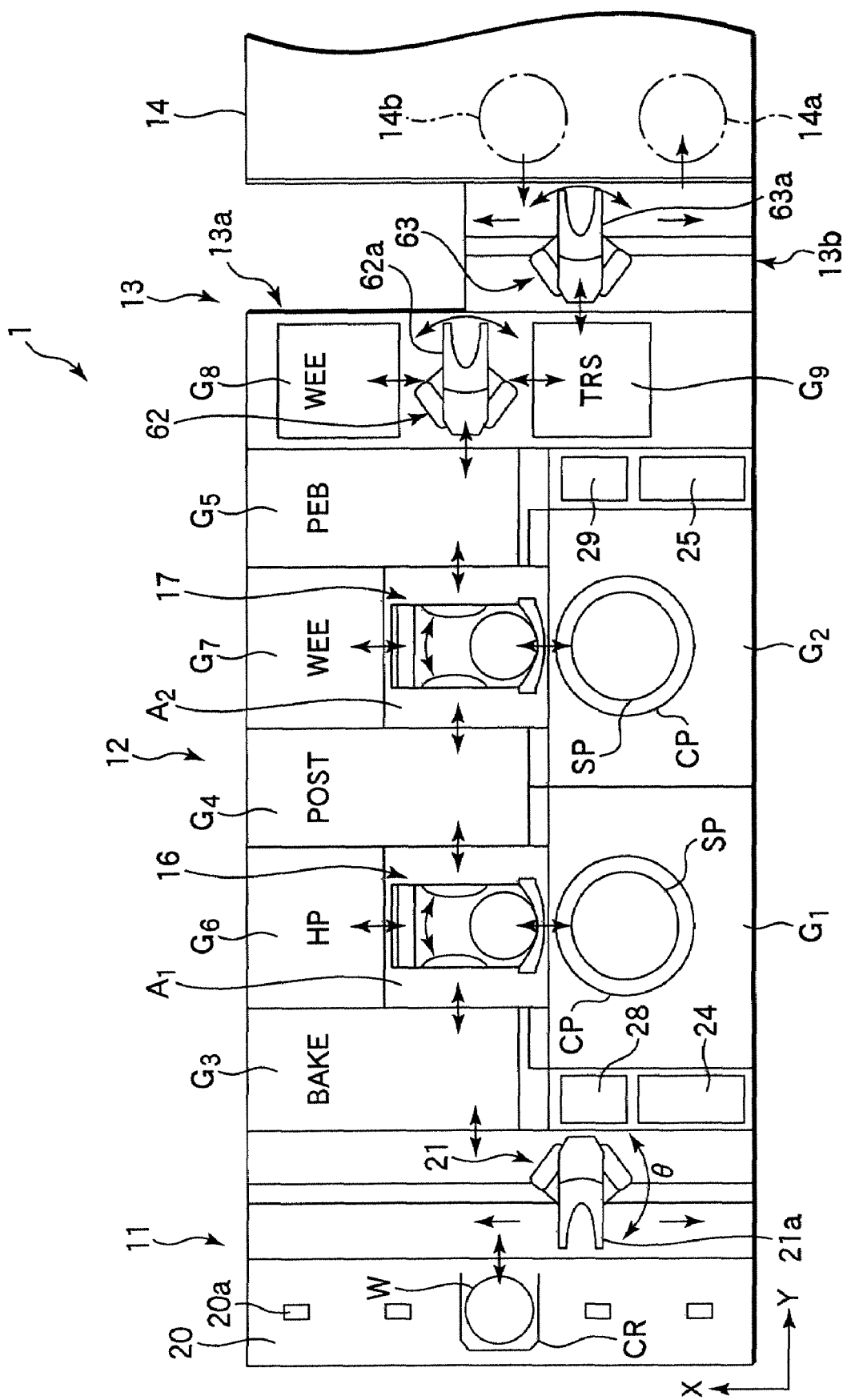
FIG. 1 is a plan view schematically showing a resist coating/developing system provided with a heat processing unit that adopts a temperature control method according to an embodiment of the present invention.
Figure 2:
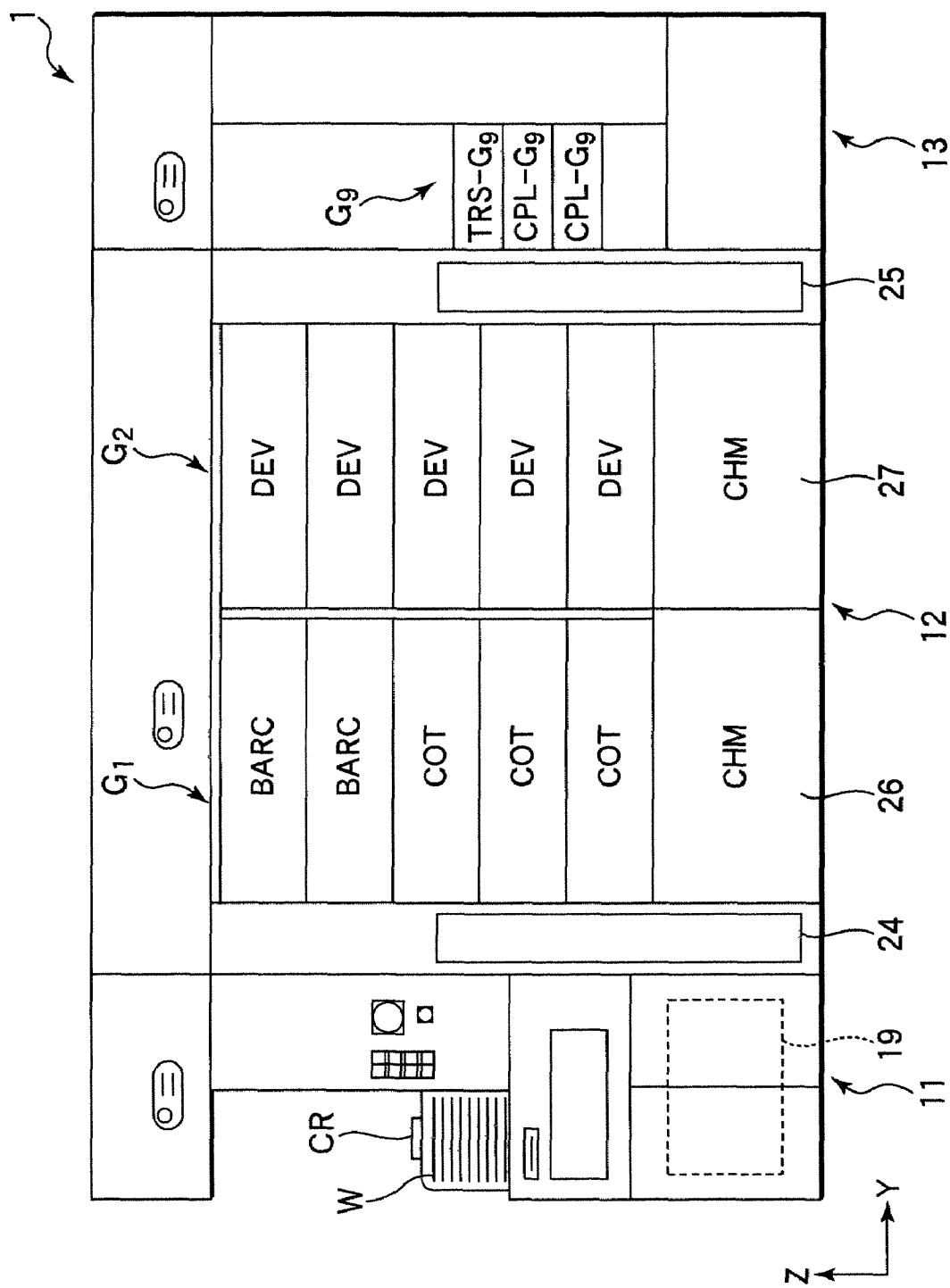
FIG. 2 is a front view of the resist coating/developing system shown in FIG. 1.
Figure 3:
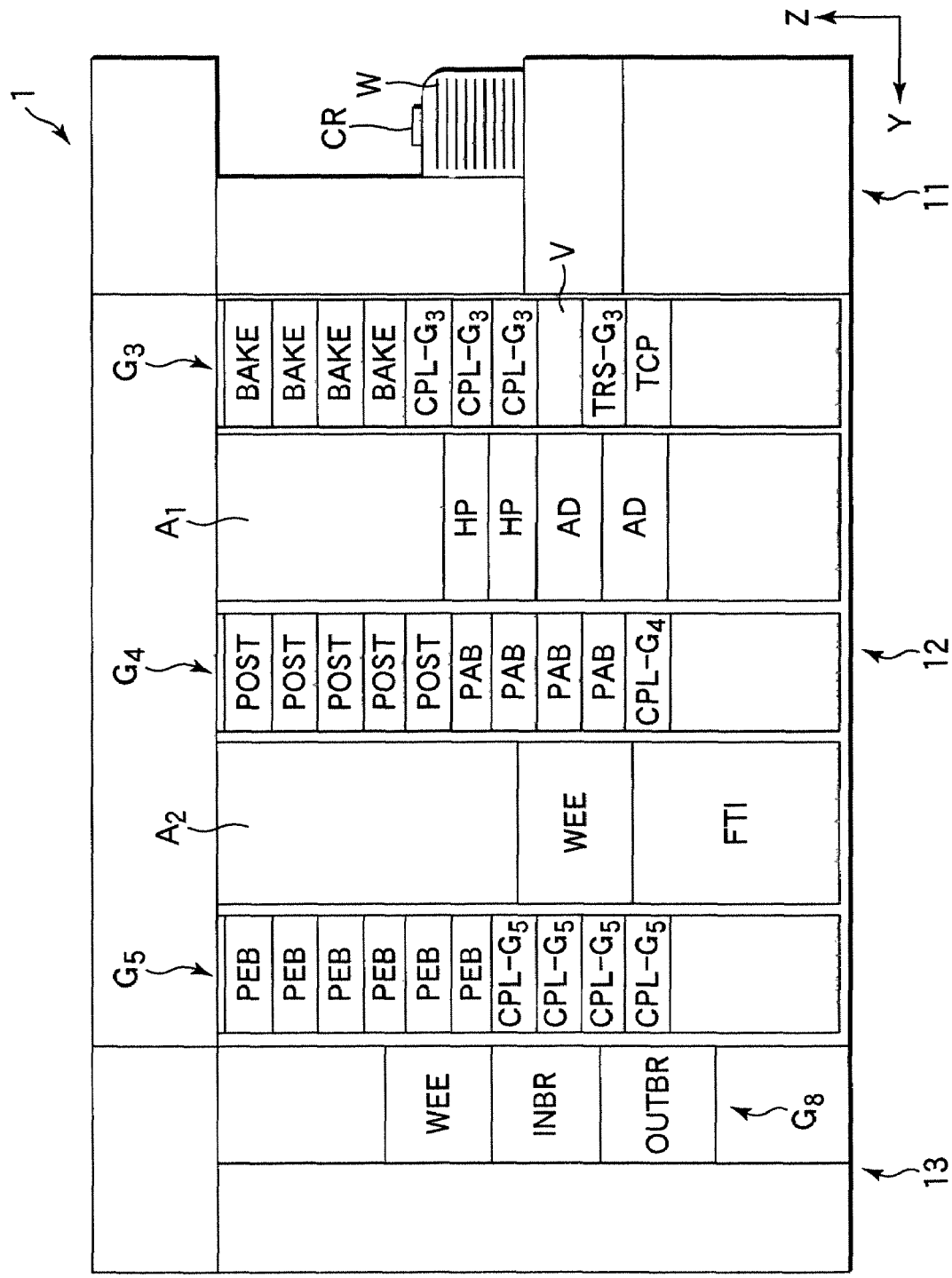
FIG. 3 is a back view of the resist coating/developing system shown in FIG. 1.

FIG. 1 is a plan view schematically showing a resist coating/developing system provided with a heat processing unit that adopts a temperature control method according to an embodiment of the present invention. FIGS. 2 and 3 are a front view and a back view, respectively, of the resist coating/developing system shown in FIG. 1.

This resist coating/developing system 1 includes a transfer station used as a cassette station 11, a process station 12 comprising a plurality of processing units, and an interface station 13 located adjacent to the process station 12 and configured to transfer wafers W between a light exposure apparatus 14 and the process station 12.

The cassette station 11 is used such that wafer cassettes (CR) are transferred thereto from other systems, wherein each of these wafer cassettes (CR) horizontally stores a plurality of wafers W to be processed in the resist coating/developing system 1. The cassette station 11 is also arranged such that wafer cassettes (CR) are transferred therefrom to other systems, wherein each of these wafer cassettes (CR) stores wafers W processed in the resist coating/developing system 1. Further, the cassette station 11 is used to transfer wafers W between the wafer cassettes (CR) and process station 12.

As shown in FIG. 1, the cassette station 11 includes a cassette table 20 having a plurality of (five in FIG. 1) positioning projections 20a formed thereon in a row in an X-direction. A wafer cassette (CR) is placed at each of the projections 20a such that its wafer transfer port faces the process station 12.

The cassette station 11 is provided with a wafer transfer mechanism 21 located between the cassette table 20 and process station 12. This wafer transfer mechanism 21 includes a wafer transfer pick 21a, which is movable in a cassette array direction (X-direction) and in a wafer array direction (Z-direction) of the wafers W stored in each wafer cassette (CR), and is further rotatable in a θ-direction show in FIG. 1. With the arrangement described above, the wafer transfer pick 21a can access any one of the wafer cassettes (CR), and also can access a transit unit (TRS-$G_3$) located in a third processing unit group $G_3$ of the process station 12 described later.

On the front side of the system, the process station 12 includes a first processing unit group $G_1$ and a second processing unit group $G_2$ arrayed in this order from the cassette station 11. Further, on the rear side of the system, the process station 12 includes a third processing unit group $G_3$, a fourth processing unit group $G_4$, and a fifth processing unit group $G_5$ arrayed in this order from the cassette station 11. A first main transfer section $A_1$ is interposed between the third processing unit group $G_3$ and fourth processing unit group $G_4$. A second main transfer section $A_2$ is interposed between the fourth processing unit group $G_4$ and fifth processing unit group $G_5$. A sixth processing unit group $G_6$ is located on the rear side of the first main transfer section $A_1$. A seventh processing unit group $G_7$ is located on the rear side of the second main transfer section $A_2$.

As shown in FIGS. 1 and 2, the first processing unit group $G_1$ includes five processing units of the spinner type stacked one on the other, which are used as liquid supply units each for performing a predetermined process on a wafer W placed on a spin chuck SP inside a cup (CP). For example, the five processing units are formed of three resist coating units (COT) and two bottom coating units (BARC) for forming an anti-reflective coating that prevents reflection of light during light exposure. The second processing unit group $G_2$ includes five processing units of the spinner type, such as developing units (DEV), stacked one on the other.

The third processing unit group $G_3$ includes ten units or the like stacked one on the other, as shown in FIG. 3, which are formed of a temperature adjusting unit (TCP), a transit unit (TRS-$G_3$), a spare space V, three high-precision temperature adjusting units (CPL-$G_3$), and four high-temperature heat processing units (BAKE) in this order from below. The transit unit (TRS-$G_3$) is used as a portion for transferring a wafer W between the cassette station 11 and first main transfer section $A_1$. The spare space V is used for attaching a desired processing unit of the oven type, such as a processing unit of the oven type for performing a predetermined process on a wafer W placed on a worktable. Each of the high-precision temperature adjusting units (CPL-$G_3$) is used for performing a heat process on a wafer W at a temperature controlled with high precision. Each of the high-temperature heat processing units (BAKE) is used for performing a predetermined heat process on a wafer W.

The fourth processing unit group $G_4$ includes ten units or the like stacked one on the other, as shown in FIG. 3, which are formed of a high-precision temperature adjusting unit (CPL-$G_4$), four pre-baking units (PAB), and five post-baking units (POST) in this order from below. Each of the pre-baking units (PAB) is used for performing a heat process on a wafer W after resist coating. Each of the post-baking units (POST) is used for performing a heat process on a wafer W after a developing process.

The fifth processing unit group $G_5$ includes ten units or the like stacked one on the other, as shown in FIG. 3, which are formed of four high-precision temperature adjusting units (CPL-$G_5$) and six post-exposure-baking units (PEB) in this order from below. Each of the post-exposure-baking units (PEB) is used for performing a heat process on a wafer W after light exposure and before development.

The high-temperature heat processing units (BAKE), pre-baking units (PAB), post-baking units (POST), and post-exposure-baking units (PEB) located in the third to fifth processing unit groups $G_3$ to $G_5$ have the same structure, as described later, which forms a heat processing unit according to this embodiment. In the third to fifth processing unit groups $G_3$ to $G_5$, the number and position of units stacked one on the other are not limited to those shown in the drawings, and they can be arbitrarily preset.

The sixth processing unit group $G_6$ includes four units or the like stacked one on the other, which are formed of two adhesion units (AD) and two heating units (HP) for heating a wafer W in this order from below. Each of the adhesion units (AD) may have a mechanism for adjusting the temperature of a wafer W. The seventh processing unit group $G_7$ includes two units or the like stacked one on the other, which are formed of a film thickness measuring unit (FTI) and a periphery light exposure unit (WEE) in this order from below. The film thickness measuring unit (FTI) is used for measuring the thickness of a resist film. The periphery light exposure unit (WEE) is used for performing light exposure selectively only on the edge portion of a wafer W. A plurality of periphery light exposure units (WEE) may be used and stacked one on the other. Further, on the rear side of the second main transfer section $A_2$, a heat processing unit, such as a heating unit (HP), may be disposed, as in the rear side of the first main transfer section $A_1$.

The first main transfer section $A_1$ is provided with a first main wafer transfer unit 16, which can selectively access the units located in the first processing unit group $G_1$, third processing unit group $G_3$, fourth processing unit group $G_4$, and sixth processing unit group $G_6$. The second main transfer section $A_2$ is provided with a second main wafer transfer unit 17, which can selectively access the units located in the second processing unit group $G_2$, fourth processing unit group $G_4$, fifth processing unit group $G_5$, and seventh processing unit group $G_7$.

Figure 4:
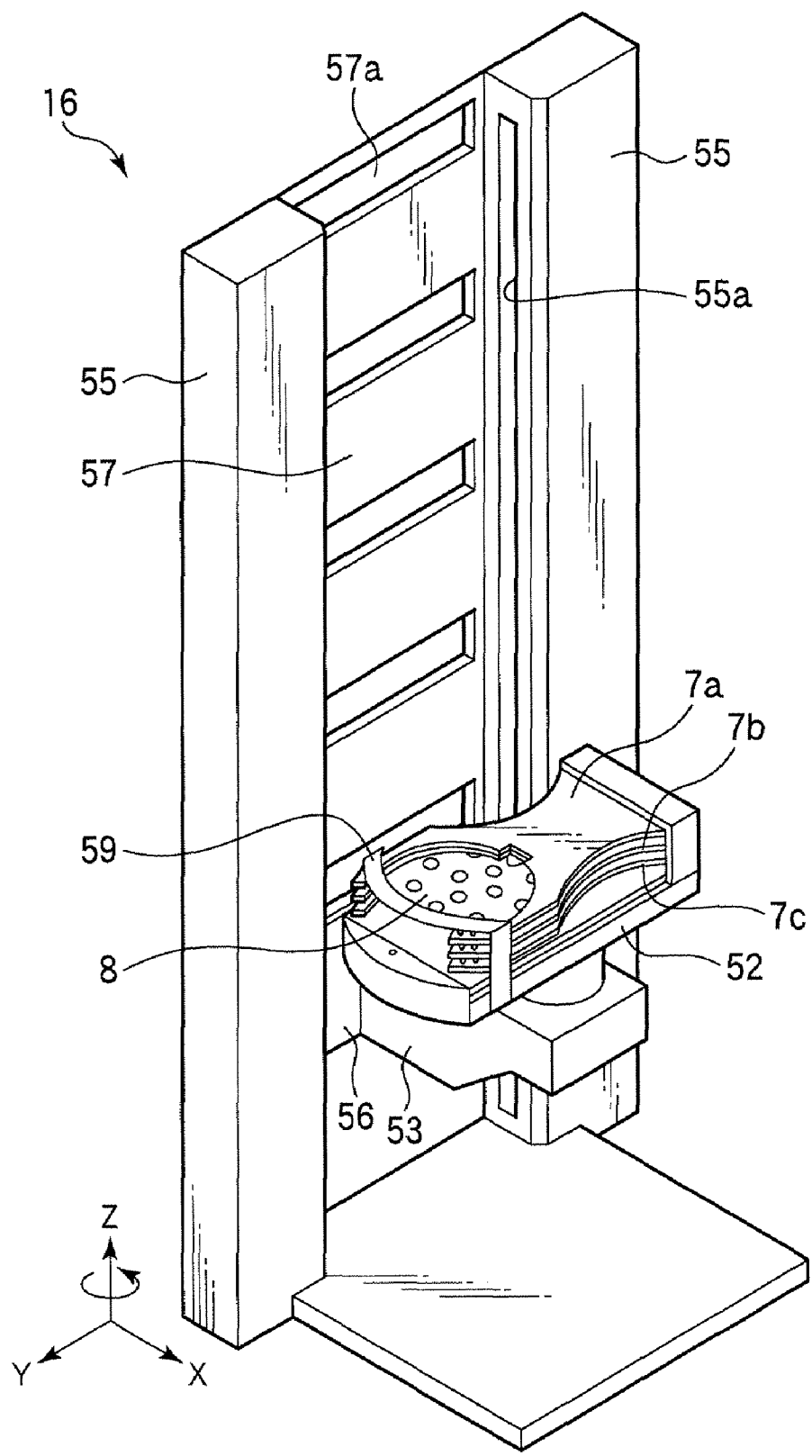
FIG. 4 is a perspective view schematically showing the structure of a main wafer transfer unit used in the resist coating/developing system shown in FIG. 1.

As shown in FIG. 4, the first main wafer transfer unit 16 includes three arms 7a, 7b, and 7c each for holding a wafer W. These arms 7a to 7c are movable back and forth along a base plate 52. The base plate 52 is rotatably supported by a support portion 53 and can be rotated by a motor built in the support portion 53. The support portion 53 is movable up and down along support struts 55 extending in the vertical direction. The support struts 55 are respectively provided with sleeves 55a extending in a vertical direction, while a flange portion 56 laterally projected from the support portion 53 slidably engages with sleeves 55a. The support portion 53 can be moved up and down by an elevating mechanism (not shown) through the flange portion 56. With this arrangement, the arms 7a to 7c of the first main wafer transfer unit 16 are movable in the X-direction, Y-direction, and Z-direction, and is rotatable in the X-Y plane. Consequently, as described above, the first main wafer transfer unit 16 can selectively access the units located in the first processing unit group $G_1$, third processing unit group $G_3$, fourth processing unit group $G_4$, and sixth processing unit group $G_6$.

A shield plate 8 is attached between the arm 7a and arm 7b to block off radiation heat from these arms. Further, a light emitting element (not shown) of a sensor member 59 is located above the distal end of the uppermost arm 7a, while a light receiving element (not shown) is attached at the distal end of the base plate 52. The light emitting element and light receiving element constitute an optical sensor to confirm the presence/absence and protruding of a wafer W on each of the arms 7a to 7c. FIG. 4 also shows a wall portion 57 as a part of the housing of the first main transfer section $A_1$ on the first processing unit group $G_1$ side. The wall portion 57 has window portions 57a formed therein, through which a wafer W is transferred to and from the respective units of the first processing unit group $G_1$. The second main wafer transfer unit 17 has the same structure as that of the first main wafer transfer unit 16.

A liquid temperature adjusting pump 24 and a duct 28 are located between the first processing unit group $G_1$ and cassette station 11. A liquid temperature adjusting pump 25 and a duct 29 are located between the second processing unit group $G_2$ and interface station 13. The liquid temperature adjusting pumps 24 and 25 are used for supplying predetermined process liquids to the first processing unit group $G_1$ and second processing unit group $G_2$, respectively. The ducts 28 and 29 are used for supplying clean air into the processing unit groups $G_1$ to $G_5$ from an air conditioner (not shown) located outside the resist coating/developing system 1.

The first to seventh processing unit groups $G_1$ to $G_7$ are detachable for a maintenance operation. The rear side panel of the process station 12 is also detachable or openable. Further, chemical units (CHM) 26 and 27 are respectively located below the first processing unit group $G_1$ and second processing unit group $G_2$ and are used for supplying predetermined process liquids to the first processing unit group $G_1$ and second processing unit group $G_2$.

The interface station 13 comprises a first interface station 13a on the process station 12 side, and a second interface station 13b on the light exposure apparatus 14 side. The first interface station 13a is provided with a first wafer transfer device 62 that faces an opening of the fifth processing unit group $G_5$. The second interface station 13b is provided with a second wafer transfer device 63 movable in the X-direction.

An eighth processing unit group $G_8$ is located on the rear side of the first wafer transfer device 62. The eighth processing unit group $G_8$ includes units or the like stacked one on the other, as shown in FIG. 3, which are formed of an outgoing buffer cassette (OUTBR), an incoming buffer cassette (INBR), and a periphery light exposure unit (WEE) in this order from below. The outgoing buffer cassette (OUTBR) is used for temporarily placing wafers W transferred from the light exposure apparatus 14. The incoming buffer cassette (INBR) is used for temporarily placing wafers W to be transferred into the light exposure apparatus 14. Each of the incoming buffer cassette (INBR) and outgoing buffer cassette (OUTBR) is configured to accommodate a plurality of, e.g., 25, wafers W. Further, a ninth processing unit group $G_9$ is located on the front side of the first wafer transfer device 62. The ninth processing unit group $G_9$ includes units or the like stacked one on the other, as shown in FIG. 2, which are formed of two high-precision temperature adjusting units (CPL-$G_9$) and a transit unit (TRS-$G_9$) in this order from below.

The first wafer transfer device 62 includes a wafer transfer fork 62a, which is movable in the Z-direction, rotatable in the θ-direction, and further movable back and forth in the X-Y plane. This fork 62a can selectively access the units located in the fifth processing unit group $G_5$, eighth processing unit group $G_8$, and ninth processing unit group $G_9$, so that wafers W can be transferred among these units.

Similarly, the second wafer transfer device 63 includes a wafer transfer fork 63a, which is movable in the X-direction and Z-direction, rotatable in the θ-direction, and further movable back and forth in the X-Y plane. This fork 63a can selectively access the units located in the ninth processing unit group $G_9$, and an incoming stage 14a and an outgoing stage 14b of the light exposure apparatus 14, so that wafers W can be transferred among these portions.

Figure 5:
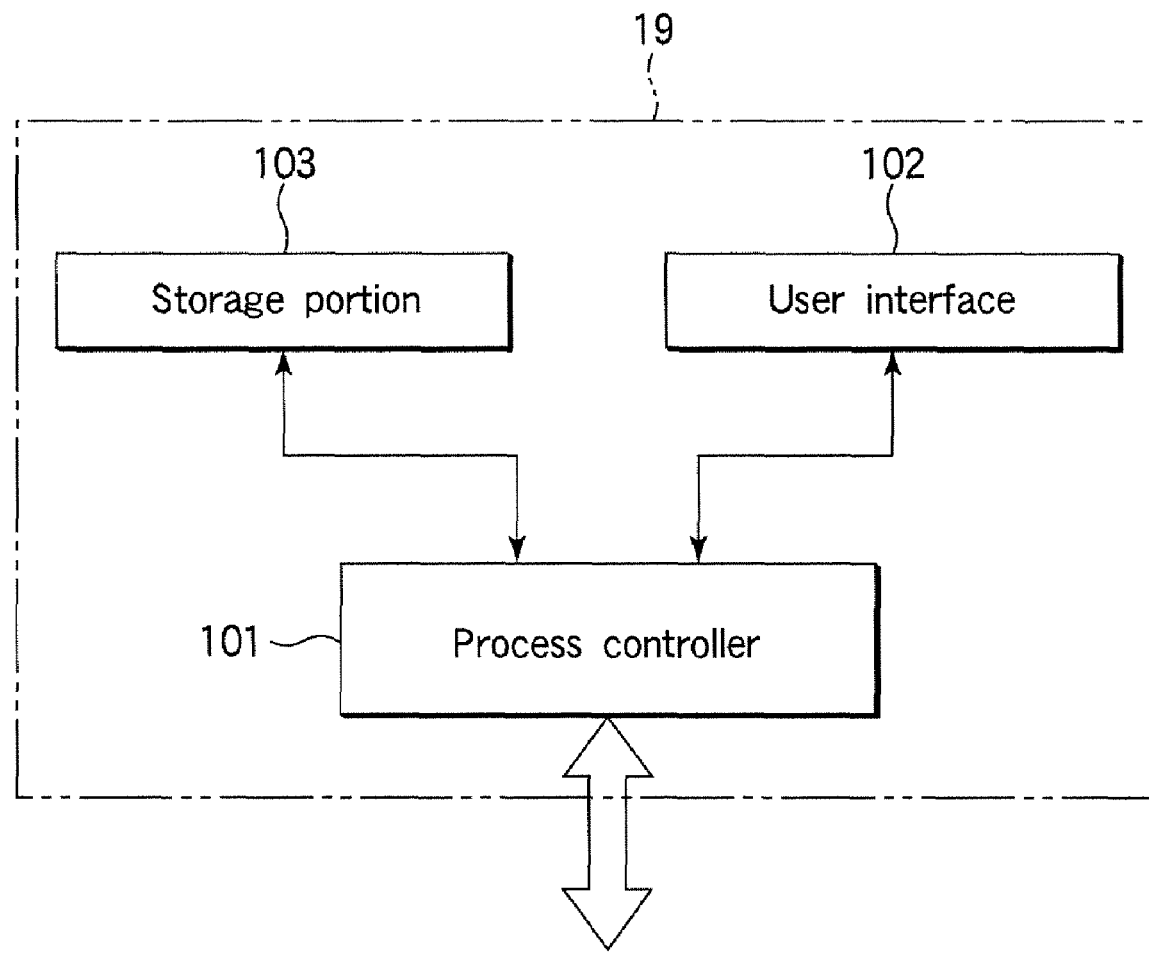
FIG. 5 is a block diagram showing a control system used in the resist coating/developing system shown in FIG. 1.

As shown in FIG. 2, a central control section 19 is located below the cassette station 11 and is used for controlling this resist coating/developing system 1, as a whole. As shown in FIG. 5, this central control section 19 includes a process controller 101 comprising a CPU for controlling the respective components included in the resist coating/developing system 1, such as the processing units and transfer mechanisms. The process controller 101 is connected to the user interface 102, which includes, e.g., a keyboard and a display, wherein the keyboard is used for a process operator to input commands for operating the respective components in the resist coating/developing system 1, and the display is used for showing visualized images of the operational status of the respective components in the resist coating/developing system 1. Further, the process controller 101 is connected to a storage portion 103 that stores various databases and recipes, i.e., control programs for the process controller 101 to control the resist coating/developing system 1 so as to perform various processes, and control programs for the respective components of the resist coating/developing system 1 to perform predetermined processes in accordance with process conditions. The recipes are stored in a storage medium included in the storage portion 103. The storage medium may be formed of a medium of the stationary type, such as a hard disk, or a medium of the portable type, such as a CDROM, DVD, or flash memory. Alternatively, the recipes may be used online while they are transmitted from another apparatus through, e.g., a dedicated line, as needed.

A required recipe is retrieved from the storage portion 103 and executed by the process controller 101 in accordance with an instruction or the like input through the user interface 102. Consequently, the resist coating/developing system 1 can perform a predetermined process under the control of the process controller 101.

In the resist coating/developing system 1 arranged as described above, unprocessed wafers W are taken out one by one from a wafer cassette (CR) by the wafer transfer mechanism 21. A wafer W thus taken out is transferred by the wafer transfer mechanism 21 into the transit unit (TRS-$G_3$) located in the processing unit group $G_3$ of the process station 12. Then, the wafer W receives a temperature adjusting treatment in the temperature adjusting unit (TCP). Then, the wafer W is sequentially subjected to formation of an anti-reflective coating performed by one of the bottom coating units (BARC) of the first processing unit group $G_1$, a heat process performed by one of the heating units (HP), and a baking process performed by one of the high-temperature heat processing units (BAKE). Before the formation of an anti-reflective coating performed by one of the bottom coating units (BARC), the wafer W may be subjected to an adhesion process performed by one of the adhesion units (AD). Then, the wafer W receives a temperature adjusting treatment in the high-precision temperature adjusting unit (CPL-$G_4$). Then, the wafer W is transferred into one of the resist coating unit (COT) located in the first processing unit group $G_1$, in which the wafer W is subjected to a process for applying a resist liquid. Thereafter, the wafer W is sequentially subjected to a pre-baking process performed by one of the pre-baking units (PAB) located in the fourth processing unit group $G_4$, and a periphery light exposure process performed by one of the periphery light exposure units (WEE). Then, the wafer W receives a temperature adjusting treatment in the high-precision temperature adjusting unit (CPL-$G_4$) or the like. Thereafter, the wafer W is transferred by the second wafer transfer device 63 into the light exposure apparatus 14. After the wafer W is subjected to a light exposure process performed by the light exposure apparatus 14, the wafer W is transferred by the second wafer transfer device 63 into the transit unit (TRS-$G_9$). Then, the wafer W is transferred by the first wafer transfer device 62 into one of the post-exposure-baking units (PEB) located in the fifth processing unit group $G_5$, in which the wafer W is subjected to a post-exposure-baking process. Further, the wafer W is transferred into one of the developing units (DEV) located in the second processing unit group $G_2$, in which the wafer W is subjected to a developing process. Then, the wafer W is subjected to a post-baking process performed by the post-baking unit (POST). Then, the wafer W receives a temperature adjusting treatment in one of the high-precision temperature adjusting units (CPL-$G_3$). Then, the wafer W is transferred by the transit unit (TRS-$G_3$) to a predetermined position in a wafer cassette (CR) placed on the cassette station 11.

Figure 6:
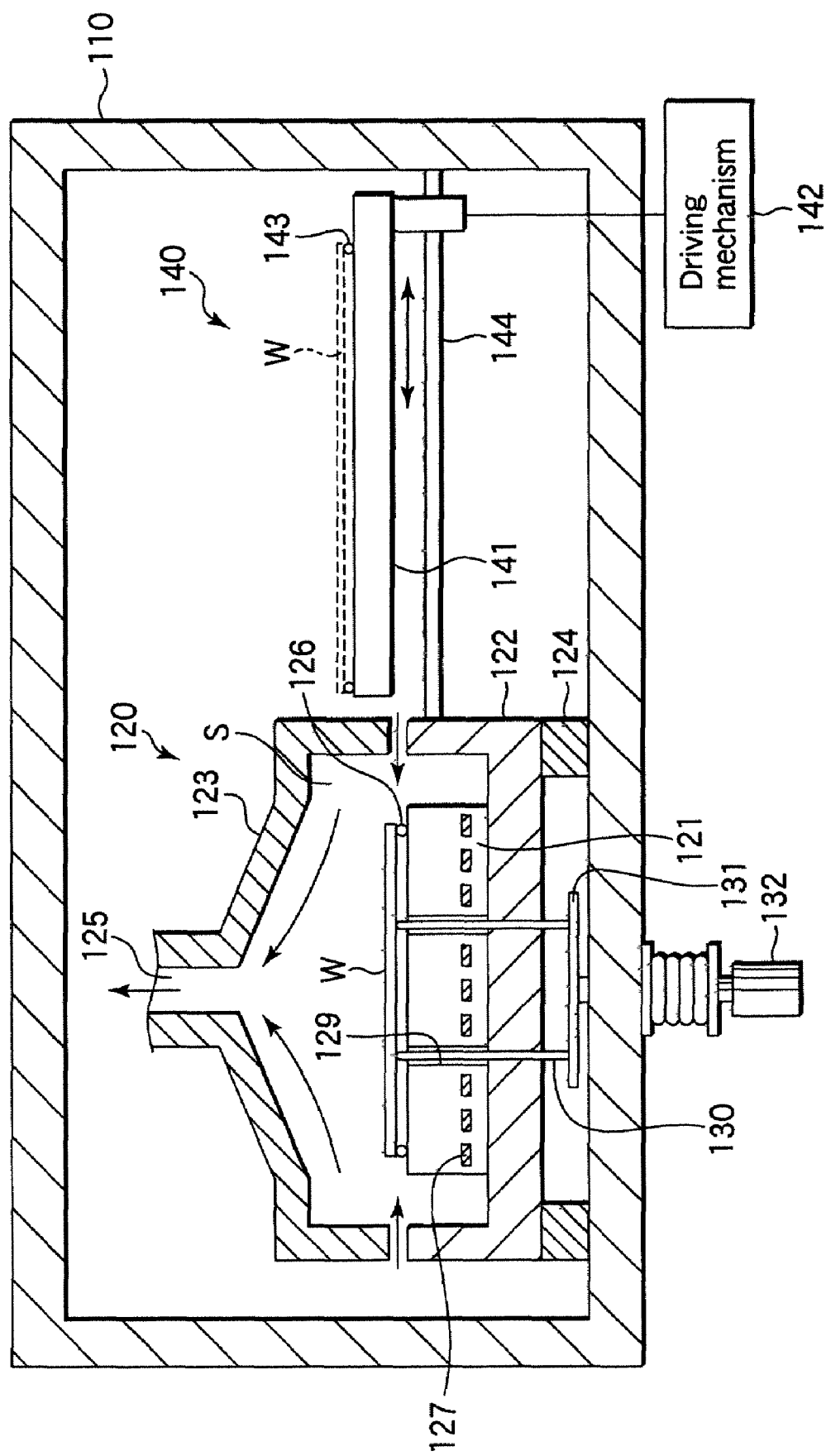
FIG. 6 is a sectional view showing a heat processing unit that performs a temperature control method according to an embodiment of the present invention.
Figure 7:
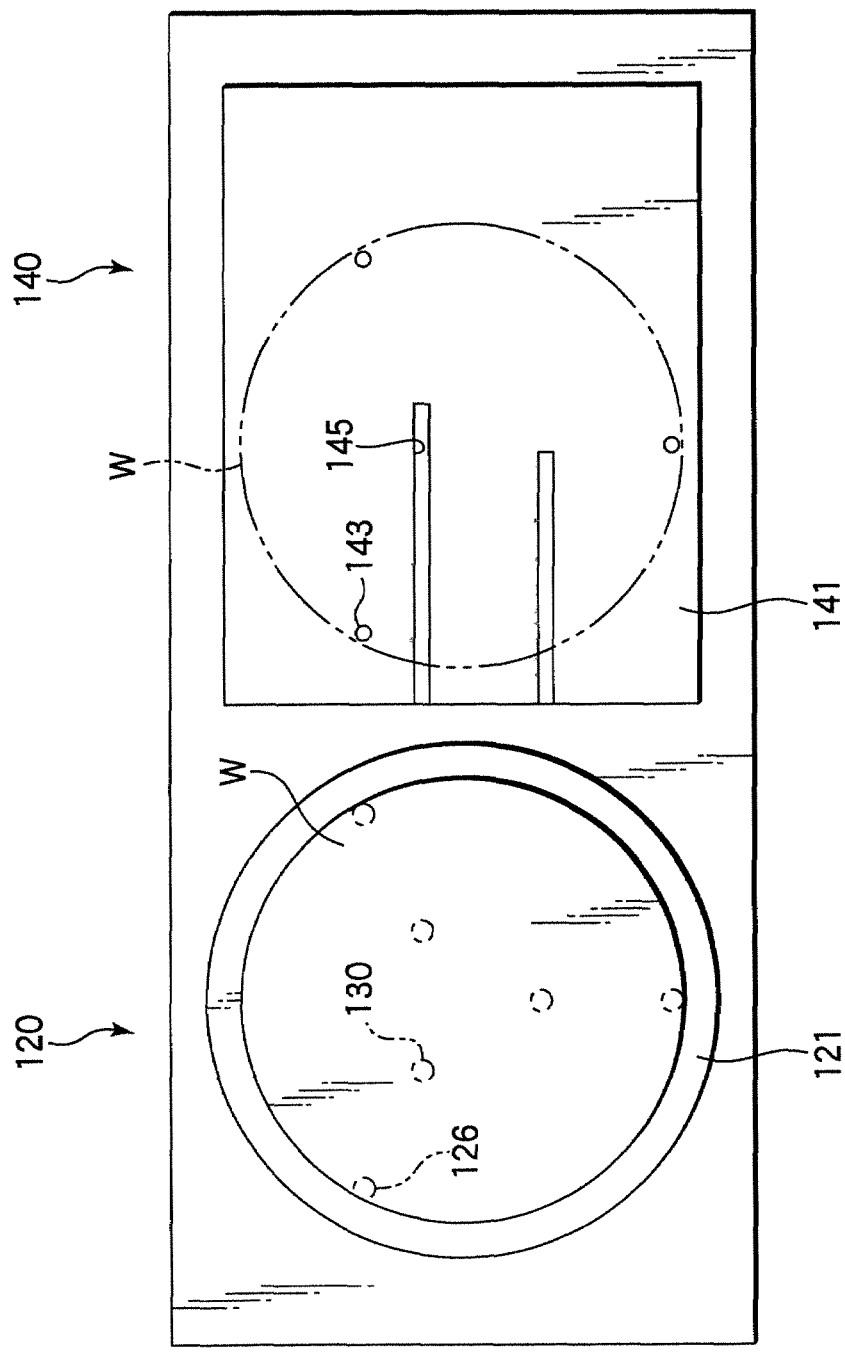
FIG. 7 is a plan view schematically showing the interior of the heat processing unit that performs a temperature control method according to an embodiment of the present invention.

Next, a detailed explanation will be given of the heat processing unit that adopts a control method according to an embodiment of the present invention. As described above, the high-temperature heat processing units (BAKE), pre-baking units (PAB), post baking units (POST), and post-exposure-baking units (PEB) have the same structure, which forms a heat processing unit according to this embodiment, i.e., a heat processing unit (CHP) provided with a cooling function. FIG. 6 is a sectional view showing the heat processing unit (CHP). FIG. 7 is a plan view schematically showing the interior of the heat processing unit.

This heat processing unit (CHP) includes a casing 110, in which a heating section (heat processing section) 120 is located on one side, and a cooling section 140 is located on the other side.

The heating section (heat processing section) 120 is used for performing a baking process after light exposure, by heating a wafer W, and includes a hot plate 121 like a circular plate for heating a wafer W. The hot plate 121 is supported within the inner space of a support member 122 having a compressed cylindrical shape opened upward. The upper side of the support member 122 is covered with a cover 123 having a conical shape gradually increasing the height from the periphery toward the center. The cover 123 has an exhaust port 125 connected to an exhaust line at the top of the center. The cover 123 can be moved up and down by an elevating mechanism (not shown). When the cover 123 is set at the upper position, the wafer W can be loaded and unloaded to and from the hot plate 121. When the cover 123 is set at the lower position, the lower end of the cover 123 comes into close contact with the upper end of the support member 122 to form a heat processing space S. The support member 122 is fixed on a spacer 124 placed on the bottom of the casing 110.

The hot plate 121 is made of, e.g., aluminum, and is provided with proximity pins 126 on the surface. The wafer W is placed on the proximity pins 126 to be adjacent to the hot plate 121. The hot plate 121 has a heater 127 built therein, which is formed of a plurality of channels as described later. When electricity is applied to the respective channels of the heater 127, the respective channels of the hot plate 121 are heated to predetermined temperatures.

The hot plate 121 has three through holes 129 formed therein at the central portion (only two of them are shown in FIG. 6). Lifter pins 130 are respectively inserted in these through holes 129 and are movable up and down to move the wafer W up and down. The lifter pins 130 are attached to a support plate 131 and are moved up and down along with the support plate 131 by a cylinder mechanism 132 located below the casing 110.

The cooling section 140 is used for cooling the wafer W after it is heated by the heating section 120, so that the wafer W is set at a predetermined temperature. The cooling section 140 includes a cooling plate 141 provided with a coolant passage (not shown), and a driving mechanism 142 for moving the cooling plate 141 in a horizontal direction to transfer the wafer W between the cooling section 140 and heating section 120. The cooling plate 141 is provided with proximity pins 143 thereon, so that the wafer W is placed on the proximity pins 143 to be adjacent to the cooling plate 141 during a cooling process. The driving mechanism 142 comprises a suitable mechanism, such as a belt mechanism or ball screw mechanism, to move the cooling plate 141 along a guide 144. When the wafer W is transferred to and from the hot plate 121, the cooling plate 141 is moved to the heating section (heat processing section) 120 side. When a cooling process is performed, the cooling plate 141 is set at a reference position shown in FIG. 6. In order to prevent the cooling plate 141 thus moved from interfering with the lifter pins 130, the cooling plate 141 has grooves 145 extending in a transfer direction of the cooling plate 141, as shown in FIG. 7.

Figure 8:
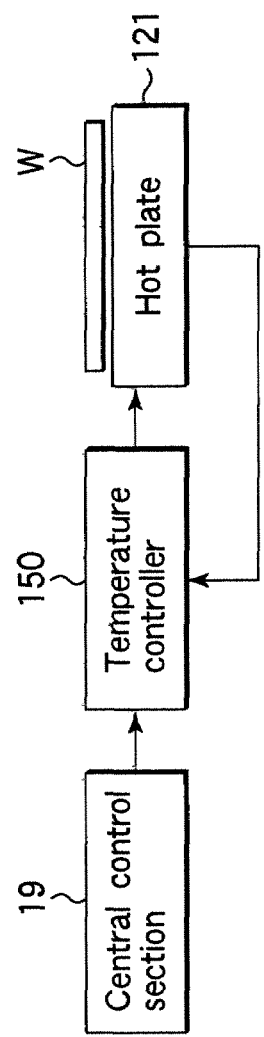
FIG. 8 is a block diagram showing a temperature control mechanism used in the heat processing unit.
Figure 9:
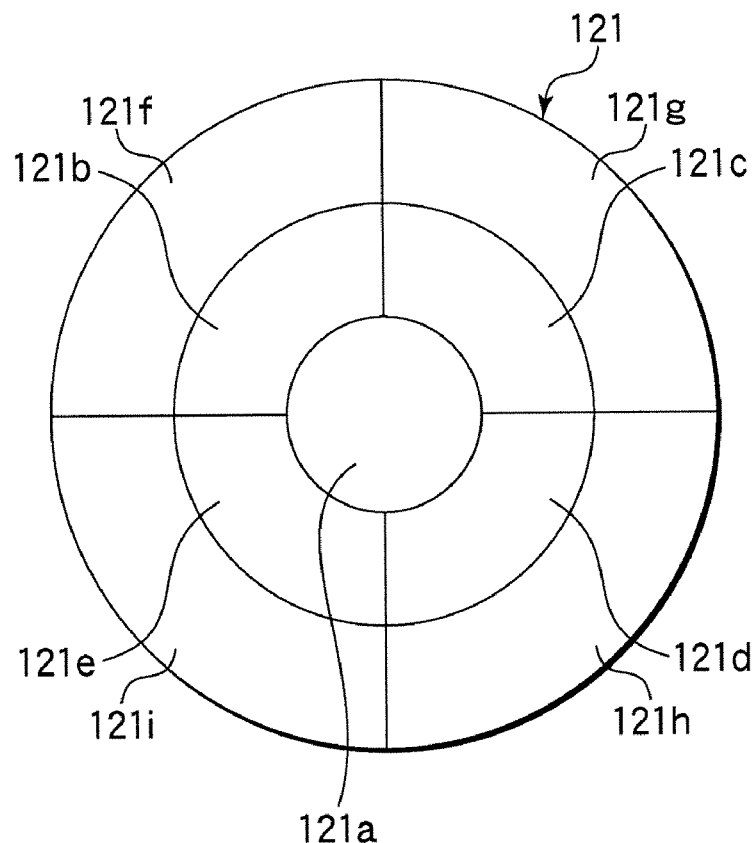
FIG. 9 is a view showing a hot plate formed of segments, used in the heat processing unit.

Next, an explanation will be given of a temperature control mechanism used for the hot plate 121 of the heat processing unit (CHP), with reference to the block diagram shown in FIG. 8. As shown in FIG. 8, a temperature controller 150 is disposed to adjust the temperature of the hot plate 121 for performing a heat process on a target object or wafer W. The temperature controller 150 controls the hot plate 121 so that its temperature becomes a target temperature by outputting an operation amount, provided by a PID operation and the like based on a deviation between a predetermined target temperature and a detected temperature from a sensor (not shown) disposed near the surface of the hot plate 121, to a SSR (solid state relay) or magnetic switch (not shown) and the like to control a supply current to a heater (not shown) arranged on the hot plate 121. In this embodiment, as shown in FIG. 9, the hot plate 121 is divided into nine channels 121a to 121i, which are respectively provided with temperature sensors and heaters, so that the temperatures of the channels can be respectively controlled. The temperature controller 150 is connected to the central control section 19.

In heat processing of wafers W, the temperature of the wafers W sequentially heat-processed is not measured but the temperature of the hot plate 121 is controlled by the temperature controller 150.

According to this heat processing of a wafer W, when the wafer W is mounted on the hot plate 121 that is stabilized at a target temperature and the heat process is started, the temperature of a circular wafer W shows a planar variation on the surface thereof due to a difference in heat release between positions on the surface of the wafer W.

Figure 10:
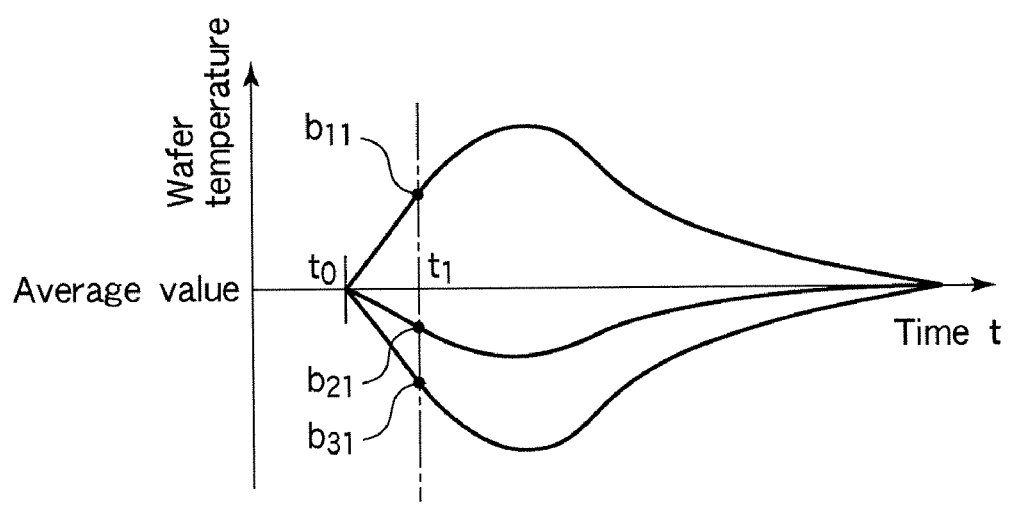
FIG. 10 is a view showing a variation of a measured temperature at each measurement point of a wafer from an average value.

FIG. 10 shows a variation in measured temperature at a plurality of measurement points of the test wafer CW mounted on the hot plate 121 stabilized at a target temperature when a heat process is performed for the test wafer CW provided with temperature sensors thereon. In FIG. 10, the horizontal axis shows a time and the vertical axis shows a measured temperature at each of the plurality of measurement points as a temperature difference from an average value of measured temperatures. In FIG. 10, temperatures measured at three points are representatively shown.

As shown in FIG. 10, the measured temperature starts varying just after the test wafer CW is mounted on the hot plate 121 and the heat process is started at a time point t=t0, and then shows a maximum variation. Thereafter, the temperature gradually decreases the variation and becomes uniform.

In order to perform the heat process on a wafer W uniformly, it is necessary to prevent the planar variation in temperature of the wafer W and bring the measured temperature at each measurement point close to the average value. It is desired to perform the heat process in a desired state in which the variation in temperature of the wafer W is suppressed.

According to this embodiment, in order to prevent the planar variation in temperature of a wafer W or an object to be heated, the temperature of the hot plate 121 is controlled. Specifically, in addition to temperature control performed when the wafer W mounted on the hot plate 121 reaches a target temperature, the target temperature of the temperature controller 150 for controlling the temperature of the hot plate 121 is adjusted during a transient time before the wafer W reaches the heat process temperature. By adjusting the target temperature, a distribution of the temperature to prevent the variation in temperature of the wafer W is formed on the hot plate 121. With the temperature distribution formed on the hot plate 121, the temperature of the wafer W is prevented from varying. That is, by adjusting the target temperature, a variation in temperature is generated on the hot plate 121 to decrease the variation in temperature of the wafer W or an object to be heated.

Thus, adjustment information for adjusting the target temperature is applied to the temperature controller 150 as described below, and the temperature controller 150 adjusts the target temperature based on the adjustment information.

In order to prevent the temperature of the wafer W or an object to be heated from varying by adjusting the target temperature of the temperature controller 150, it is necessary to grasp a relation between the target temperature of the temperature controller 150 and the temperature of the wafer W.

For example, if it can be predicted that how the temperature of the wafer W changes when the target temperature is changed in some way, it can be predicted how to adjust the target temperature so as to change the temperature of the wafer W to prevent its variation.

Thus, relation information showing the relation between the target temperature and the temperature of the wafer W is to be acquired as follows.

Specifically, the influence of a change of the target temperature of each channel with respect to the temperature change of the wafer W is measured, so that the impact of the change in target temperature on the temperature of the wafer W is acquired as a matrix.

When heating of the hot plate 121 is controlled by the heater by changing the target temperature of each channel, heat interference is generated due to the heater of each channel, and the matrix shows the influence of this interference. This matrix is referred to as the interference matrix hereinafter.

Figure 11:
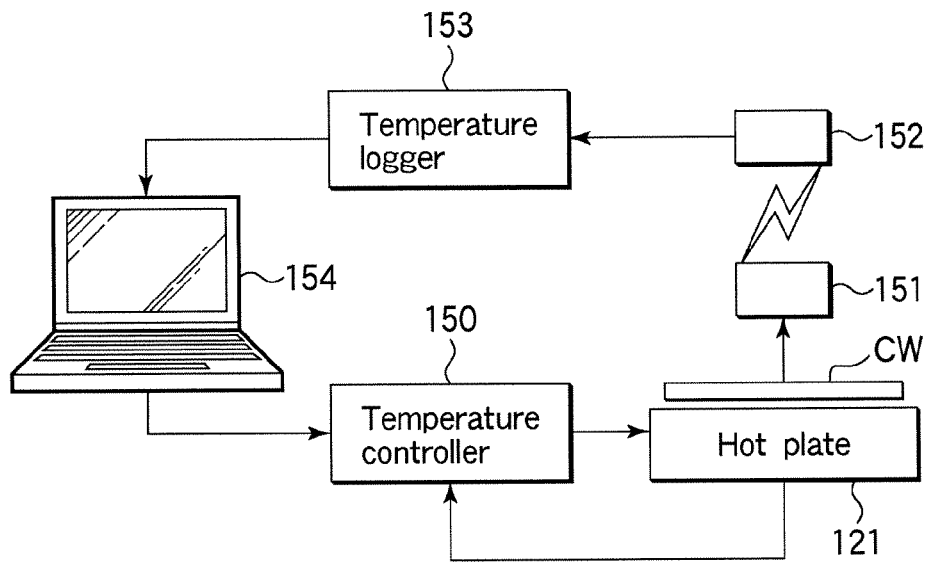
FIG. 11 is a view showing a system constitution to measure the temperature of the test wafer and control the temperature of a hot plate based thereon.

FIG. 11 shows an example of a constitution to measure the influence of the temperature change of the wafer W with respect to the change in target temperature. In FIG. 11, the same constituent elements in FIG. 8 are denoted by the same reference numerals. As shown in FIG. 11, a test wafer CW provided with temperature sensors (not shown) at a plurality of measurement points is placed on a hot plate 121. A temperature logger 153 is disposed to measure temperatures in response to detection signals from the temperature sensors of the test wafer CW. A personal computer 154 used as an adjusting apparatus is connected to the temperature logger 153 and temperature controller 150. The personal computer 154 is used only for a temperature adjusting operation, but has the all or part of the functions of the central control section 19. The personal computer 154 outputs adjustment information for adjusting the target temperature to the temperature controller 150 based on information from the temperature logger 153. The personal computer 154 can change the target temperature of the temperature controller 150 by communication with the temperature logger 153 and temperature controller 150. The personal computer 154 can measure the target temperature and the temperature of the test wafer CW at each measurement point synchronously. As the plurality of measurement points of the test wafer CW, a plurality of positions (portions) in which the variation in temperature is to be prevented are selected. In place of the personal computer 154, a PLC (Programable Logic Controller) may be used for the same purpose, or the central control section 19 may be used to perform direct control for the same purpose.

The plurality of temperature sensors of the test wafer CW are connected to a transmitter 151 through signal lines. The test wafer CW and transmitter 151 are placed inside dedicated ports (not shown) in the cassette station 11 of the resist coating/developing system 1, and are transferred by the wafer transfer mechanism 21 and first main transfer unit 16 or second main transfer unit to a heat processing unit to be subjected to temperature control when temperature measurement is performed. At this time, only the test wafer CW is placed on the hot plate 121, and the transmitter 151 is left on the transfer unit or placed on a dedicated port located outside the casing of the heat processing unit.

On the other hand, the temperature logger 153 is connected to a receiver 152 for receiving detection signals from the temperature sensors of the test wafer CW transmitted from the transmitter 151 by radio, and sending the signals to the temperature logger 153.

Figure 12:
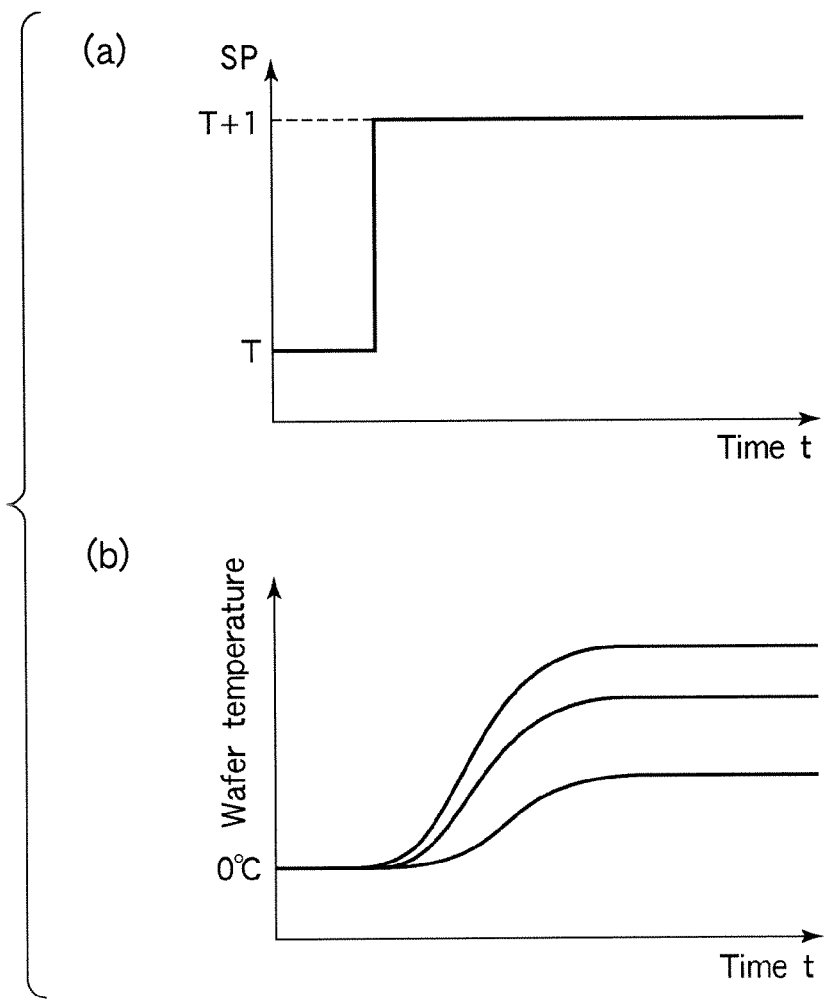
FIG. 12 is a view showing a stepped input and a stepped response waveform.

The personal computer 154 is provided with a storage medium set therein, such as a CD-ROM, which stores control programs for performing control described later, and reads and executes a program stored in the storage medium, so that it serves as a calculating device for calculating an interference matrix and adjustment information, as described later. Where the central control section 19 is used in place of the personal computer 154 for the same purpose, a storage medium of this kind is set in the storage portion 103.

Where the apparatus thus constituted is used to perform temperature control, the test wafer CW is first set on the hot plate 121. Then, a target temperature SP of the whole channels in the temperature controller 150 is set to a predetermined temperature T for the heat process as shown in FIG. 12-(a). Thus, the temperature control is started.

In a state the temperature of the hot plate 121 reaches the predetermined temperature T and stabilizes, as shown in FIG. 12-(a), the target temperature SP of a first channel ch1 is changed by 1° C., for example to be T+1 stepwise, and the temperature of the test wafer CW at that time is measured at the plurality of measurement points as shown in FIG. 12-(b). In FIG. 12-(b), three waveforms of the temperature change of the measured temperature at three measurement points are representatively shown and the temperature before change is set to 0° C.

Similarly, in a state the hot plate 121 supporting the test wafer CW reaches the predetermine temperature T and stabilizes, the target temperature of a second channel ch2 is changed by 1° C. stepwise, and the temperature of the test wafer CW is measured at the plurality of measurement points.

Thus, in a similar way, the target temperature SP is sequentially changed by 1° C. stepwise every channel and the temperature of the test wafer CW is measures at the plurality of measurement points.

Thus, there can be provided a stepped response waveform showing how the measured temperatures at the plurality of measurement points in the test wafer CW are changed when the target temperature of each channel is changed by 1° C. stepwise.

Using the thus measured stepped response waveforms, response waveforms at the plurality of measurement points in the test wafer CW with respect to the various kinds of changes in target temperature such as the change in target temperature in the form of a pulse or triangle are calculated and composed.

Figure 13:
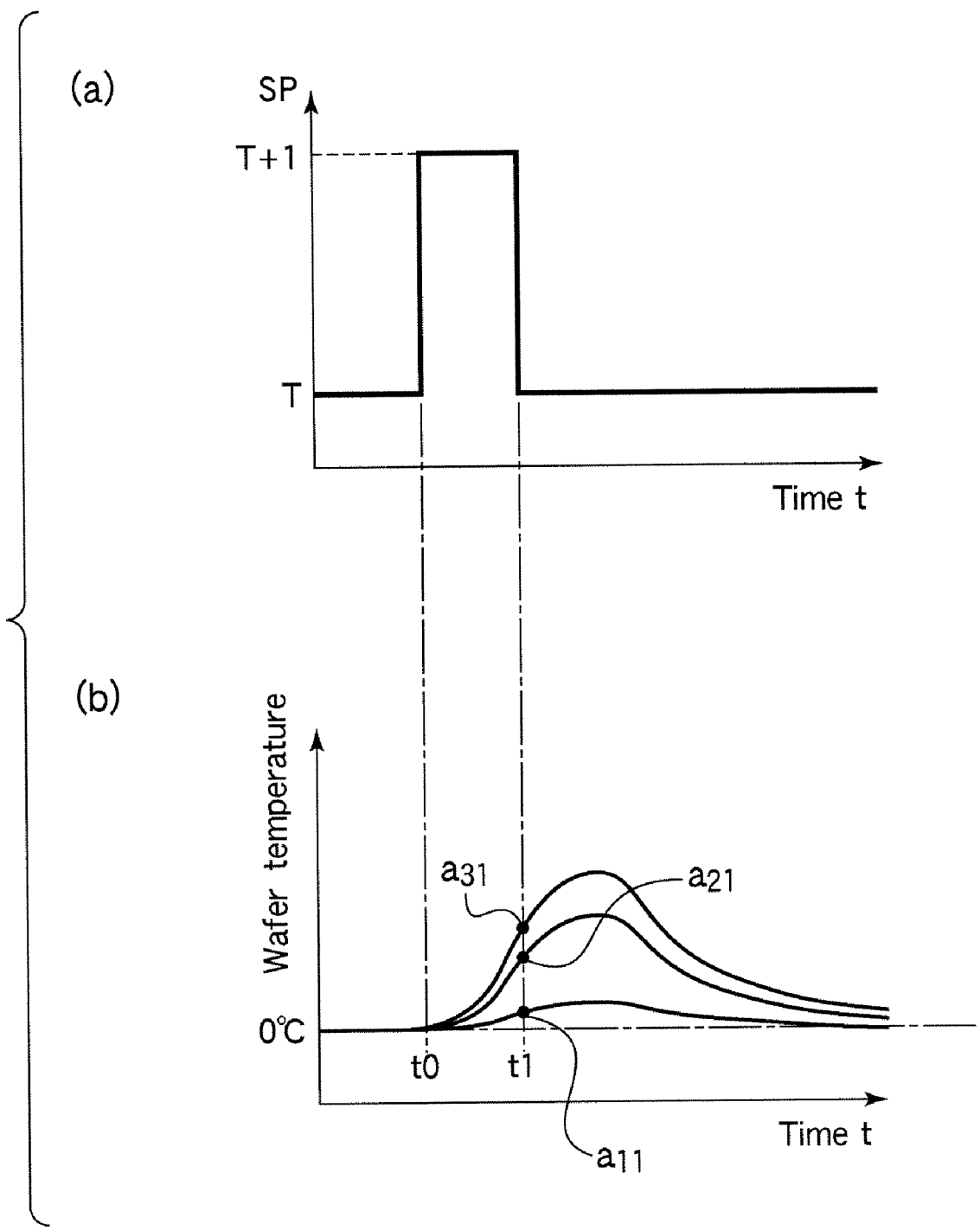
FIG. 13 is a view showing a pulsed input and a pulsed response waveform.

For example, as shown in FIG. 13-(a), when the target temperature SP is changed by 1° C. from the predetermined temperature T, a pulsed response waveform shown in FIG. 13-(b) at each measurement point of the test wafer CW as an output with respect to the input of the pulsed target temperature can be composed as follows.

Figure 14:
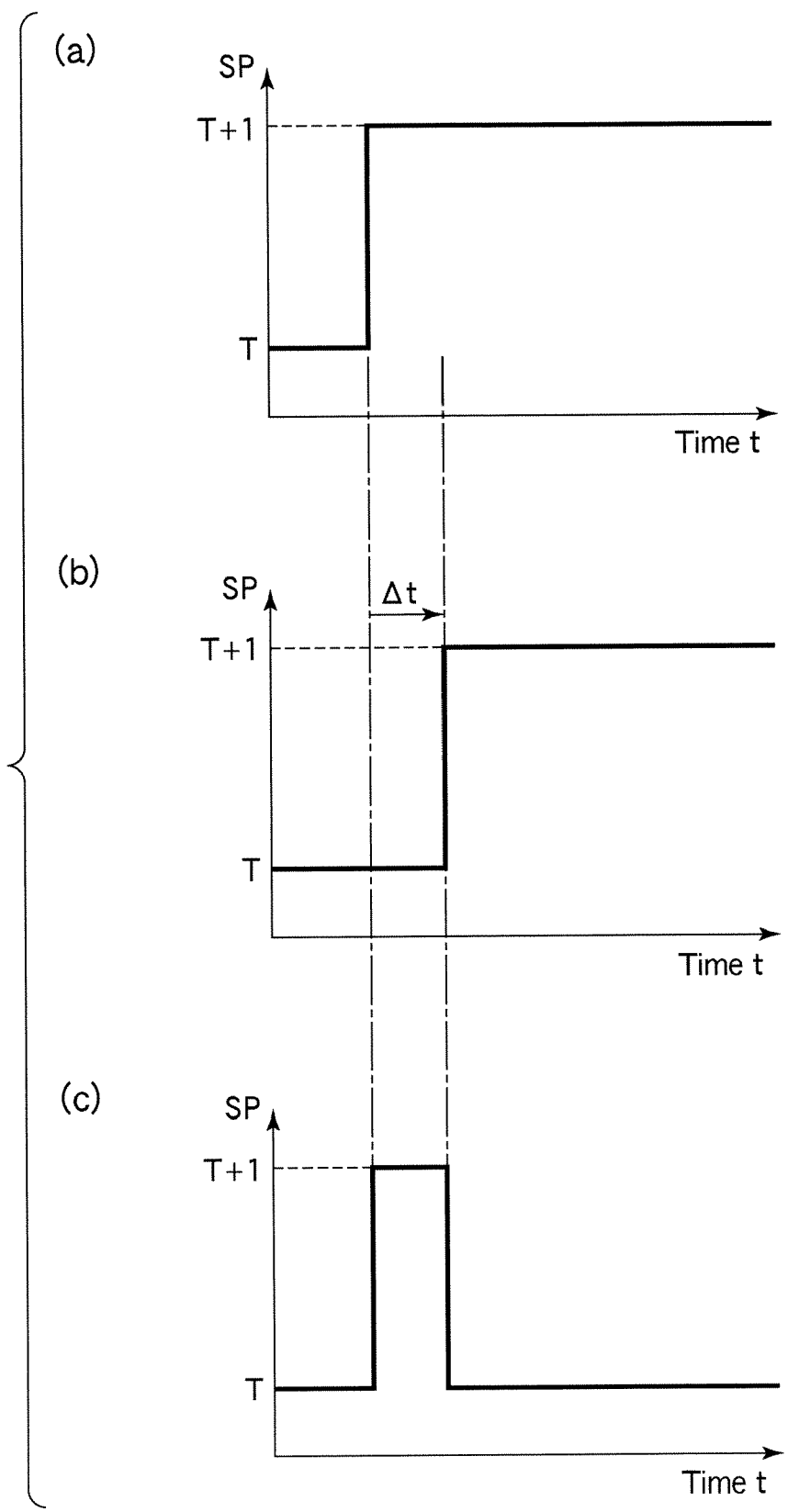
FIG. 14 is a view showing waveforms to explain composition of the pulsed input.
Figure 15:
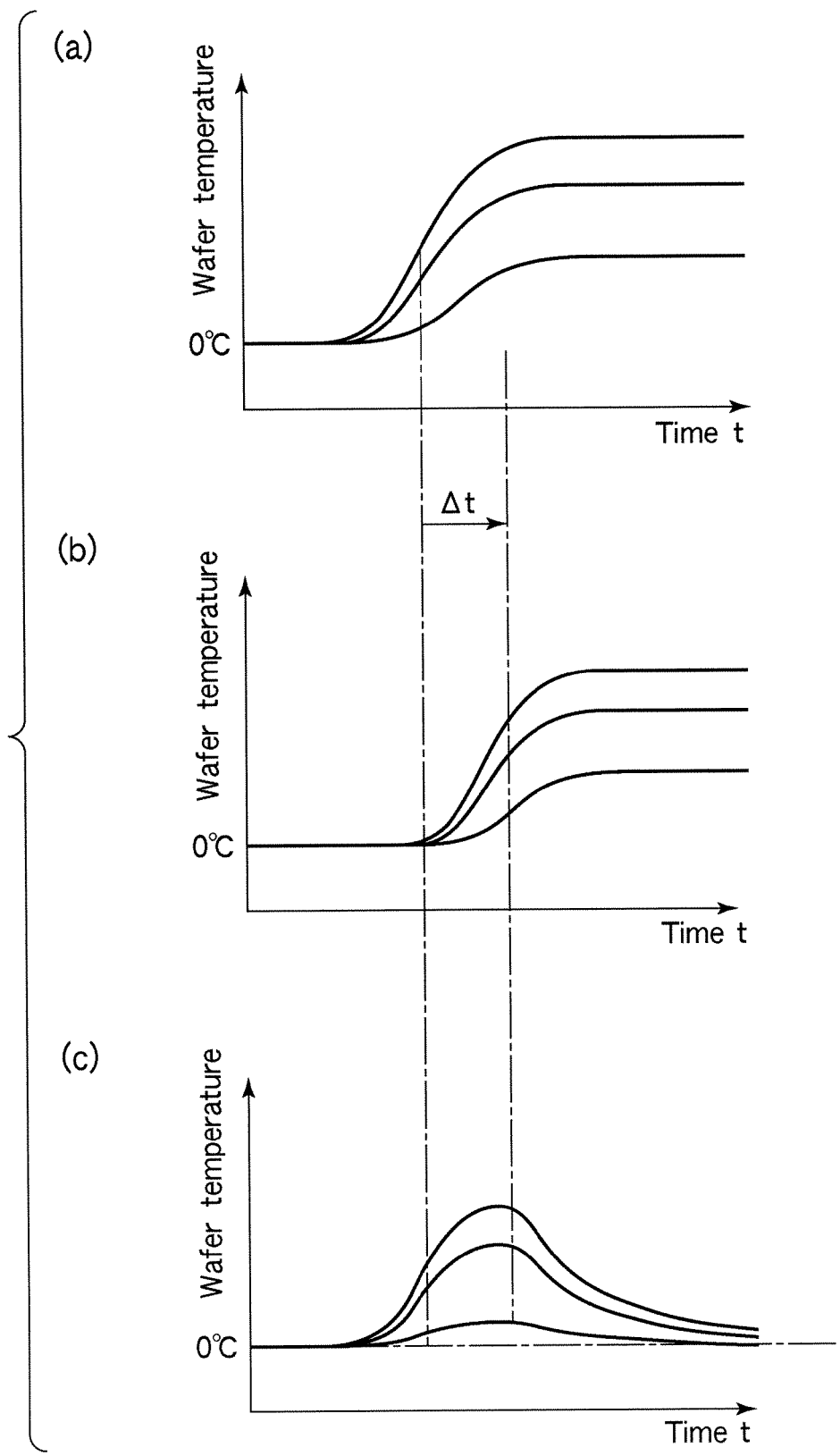
FIG. 15 is a view showing waveforms to explain composition of the pulsed response waveform.

FIGS. 14 and 15 show how to compose the pulsed response waveform, in which FIG. 14 shows the input (change) of the target temperature, and FIG. 15 shows the response waveform at each measurement point of the test wafer CW as the output corresponding to the input of the target temperature.

The stepped input of 1° C. and the stepped response waveform as the output shown in FIGS. 14-(a) and 15-(a) are delayed by Δt, 1 second, for example as shown in FIGS. 14-(b) and 15-(b), respectively. Then, by subtracting the delayed stepped input and the stepped response waveform from the stepped input and the stepped response waveform before the delay shown in FIGS. 14-(a) and 15-(a), the pulsed input by 1° C. for 1 second and the pulsed response waveform that is the output of this input are calculated as shown in FIGS. 14-(c) and 15-(c). FIGS. 14-(c) and 15-(c) are the same waveforms as those shown in FIGS. 13-(a) and (b).

Thus, by measuring the stepped response waveform shown in FIG. 12-(b) with respect to the stepped input of the target temperature shown in FIG. 12-(a), the pulsed response waveform shown in FIG. 13-(b) with respect to the pulsed input of the target temperature shown in FIG. 13-(a) can be composed through the calculation.

In addition, the above delay time Δt is appropriately selected so that a required temperature change of the stepped response waveform can be provided.

When the pulsed response waveform is composed with respect to each channel, the pulsed response waveforms at the plurality of measurement points in the test wafer CW with respect to the pulsed changes in target temperature can be acquired.

From this pulsed response waveforms, the interference matrix showing the influence of the temperatures in the plurality of measurement points in the test wafer CW with respect to the changes in target temperature can be provided.

FIG. 16 shows an example of the interference matrix, in which each row corresponds to each of the plurality of measurement points 1 to k (k is an integer of 2 or more) of the test wafer CW and each column corresponds to each of the channels ch1 to chp (p is an integer of 2 or more).

FIG. 16 shows one example of the interference matrix which is acquired from the pulsed response waveforms shown in FIG. 13-(b) at the measurement points in the wafer W at a predetermined elapsed time point t=t1 from a reference time point t=t0 when the target temperature is changed into the form of a pulse by 1° C. for 1 second as shown in FIG. 13-(a). The predetermined elapsed time point t1 is selected so as to correspond to a time to prevent the variation in temperature of the wafer W while the reference time t0 in which the target temperature is changed is set to a starting time point of the heat process of the wafer W on the hot plate 121.

For example, in the case where the target temperature of the first channel 1 is changed as shown in FIG. 13-(a) in the form of a pulse, when the first to third measurement points 1 to 3 show temperature changes $a_{11}$, $a_{21}$, and $a_{31}$ at elapsed time point t=t1 as shown in FIG. 13-(b), these temperature changes $a_{11}$, $a_{21}$, and $a_{31}$ constitute a part of the interference matrix shown in FIG. 16.

Thus, the interference matrix shown in FIG. 16 can be calculated from the response waveforms at the measurement points 1 to k at the elapsed time point t=t1 while the target temperatures of the channels ch1 to chp are changed in the form of a pulse.

From the interference matrix shown in FIG. 16, the temperature change at each measurement point of the test wafer CW can be predicted. As shown in FIG. 16, for example, when it is assumed that the target temperature of the first channel ch1 is changed by 1° C. for 1 second in the form of a pulse, a temperature is changed by 0.12° C. ($a_{11}$) at the measurement point 1 and a temperature is changed by 0.21° C. ($a_{21}$) at the measurement point 2 in the wafer W at the elapsed time point t=t1, or when it is assumed that the target temperature of the second channel ch2 is changed by 1° C. for 1 second in the form of a pulse, a temperature is changed by 0.03° C. ($a_{12}$) at the measurement point 1 and a temperature is changed by 0.08° C. ($a_{22}$) at the measurement point 2 in the wafer W at the elapsed time point t=t1.

Similar to FIG. 16, an interference matrix at a certain elapsed time point from the reference time point t=t0 when the target temperature is changed by 1° C. for 1 second in the form of a pulse can be acquired from the pulsed response waveforms shown in FIG. 13-(b). Namely, when the plurality of time points to prevent the variation in temperature of the wafer W (test wafer CW) are previously set, the interference matrix corresponding to those time points can be provided.

The interference matrix used in this embodiment will be described in detail hereinafter.

Although the interference matrix is acquired from the response waveforms at the measurement points of the wafer W with respect to the change in temperature as described above, abrupt change in target temperature causes saturation of the operation amount and complicates the control in some cases.

Thus, according to this embodiment, the target temperature is not changed in the form of a pulse and the interference matrix is acquired from the response waveform when the target temperature is changed in the form of almost a triangle, as shown in FIG. 17.

FIG. 18 shows how to compose waveforms of this temperature, in which FIG. 18-(a) uses the pulsed waveform in FIG. 13 and FIG. 18-(b) uses the stepped waveform in FIG. 12.

As shown in FIG. 18-(a), the waveform in the form of almost a triangle shown in FIG. 17 can be provided by integrating a plurality of pulsed inputs having different height (temperature change) and small time widths. The small pulsed inputs and their pulsed response waveforms can be composed such that the height (temperature change) is provided from a proportional relation and the time width is provided by subtracting the delay time Δt related to the time width in the pulsed input and its response waveform in FIG. 13 similar to FIG. 14.

The fine pulsed input in which a height is 0.1° C. and a time width is 0.1 second and its response waveforms can be composed by multiplying the heights of the pulsed input and pulsed response waveform having the height of 1° C. and the time width of 1 second in FIG. 13 by 0.1 and by subtracting the pulsed input and its pulsed response waveform delayed by 0.1 second from the input and its pulsed response waveform before the delay.

In addition, as shown in FIG. 18-(b), the waveform in the form of almost a triangle shown in FIG. 17 can be composed such that a plurality of rectangles having a small height (temperature change) and gradually decreasing time widths are laminated. Each rectangle is calculated such that heights of the stepped input and its response waveforms in FIG. 12 are acquired from a proportional relation and they are delayed so as to correspond to the above time width and this delayed waveform is subtracted from the stepped input and its response waveforms before the delay.

The almost triangular waveform can be composed into a smooth triangular waveform by use of a smaller pulse input or stepped input, and it is described as the triangular waveform in the following description and drawings. The height of the triangular waveform is 1° C., for example similar to the above, and its time width is determined by dividing a period to prevent the variation in temperature of the test wafer CW shown in FIG. 10 into the plural number. This plural number is determined in view of complication of calculating processes and an effect of variation prevention.

Thus, by calculating the interference matrix from the triangular input of the target temperature and its response waveforms, an interference matrix which can avoid the saturation of the operation amount can be provided.

Figure 19:
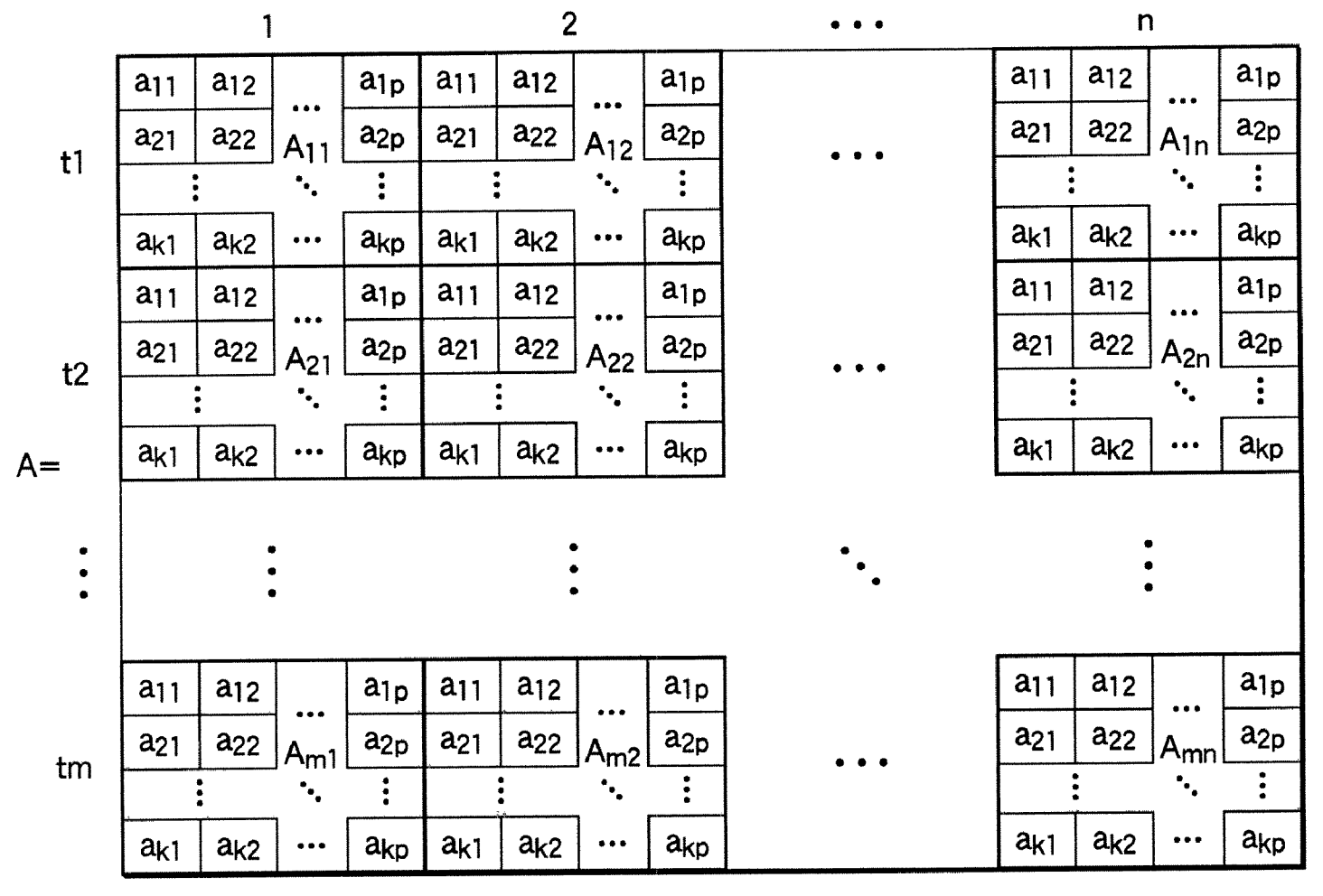

FIG. 19 shows an interference matrix A according to this embodiment, which is provided in view of temporal and special interference in order to prevent the variation in temperature of the wafer W (test wafer CW) with high precision. In addition, although the temperature changes which are components constituting each of matrixes $A_{11}$ to $A_{mn}$ are shown by $a_{11}$ to $a_{kp}$ in common in FIG. 19, they show only relations between the measurement points 1 to k and the channels ch1 to chp, and it does not mean that specific values of the temperature changes are the same.

That is, the interference matrix A shown in FIG. 19 is a matrix in view of a relation of the temporal interference shown in FIG. 20, and each matrix in FIG. 20 is a matrix in view of the special (positional) relation shown in FIG. 21, for example and has a double structure in which the matrix contains the matrixes.

First, the matrix provided in view of the temporal relation shown in FIG. 20 will be described.

Figure 22:
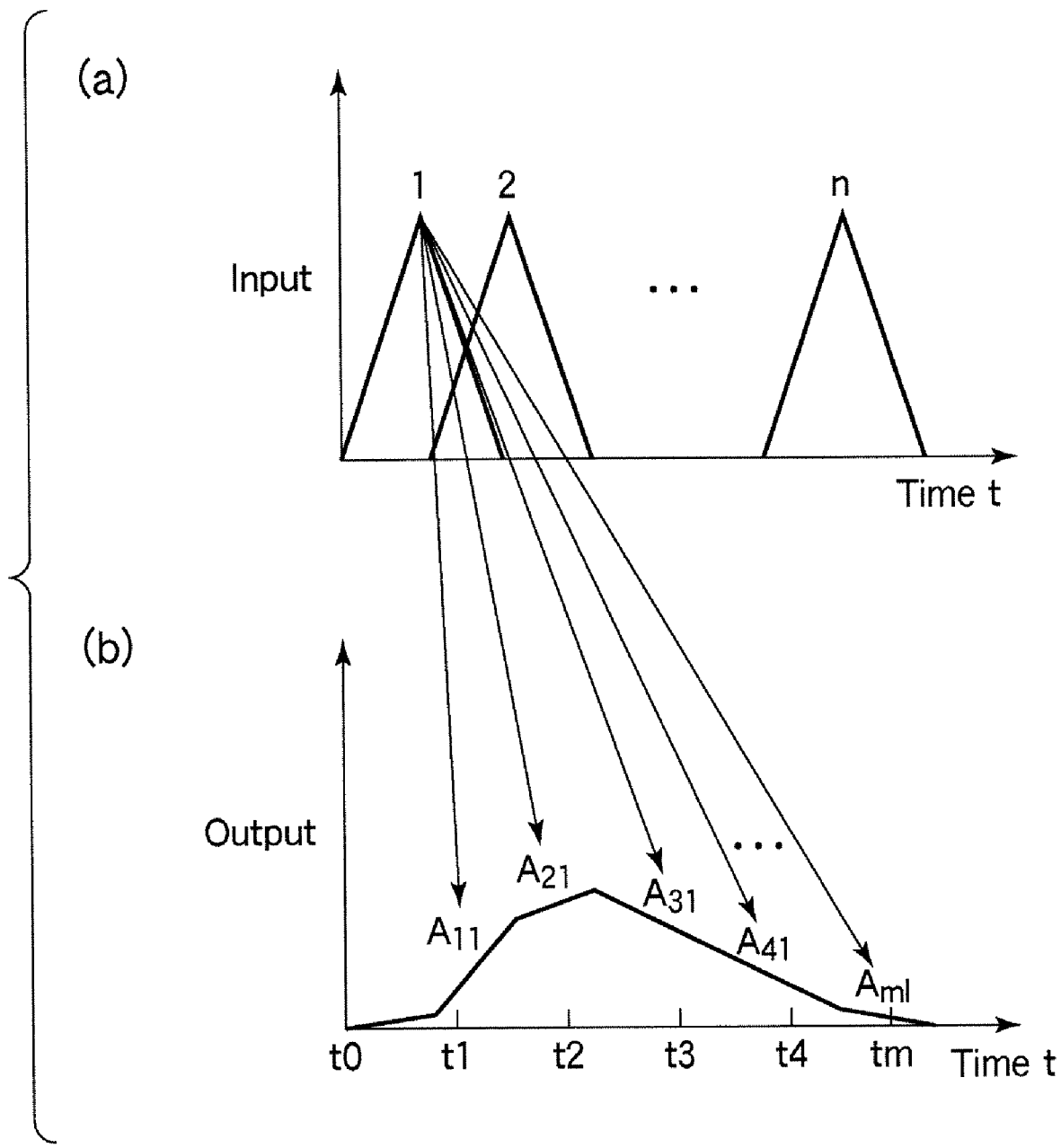
FIG. 22 is a view showing an input of a target temperature and an output as its response waveform.

FIG. 22 is a waveform diagram to explain the interference matrix shown in FIG. 20, in which FIG. 22-(a) shows a change of the temperature as an input and FIG. 22-(b) shows its response waveform as an output, for example.

Although the pulsed input of the target temperature of each of the channels ch1 to chp is only provided at the same timing in the interference matrix shown in FIG. 16, this embodiment corresponds to inputs of the target temperatures at a plurality of the first to n-th (n is an integer of 2 or more) timings having regular time differences.

That is, a corresponding matrix is calculated from each response waveform when triangular input is applied to each of the channels ch1 to chp at the first timing. Then, a corresponding matrix is calculated from each response waveform when the triangular input is applied to each of the channels ch1 to chp at the second timing delayed a certain time. Thereafter, similarly, a corresponding matrix is calculated from each response waveform when the triangular input is applied to each of the channels ch1 to chp at the n-th timing.

At this time, regardless of the first to n-th timings of the inputs of the target temperatures, each of the elapsed time points t=t1 to tm (m is an integer of 2 or more) in the response waveform shown in FIG. 22 is defined based on the time point t0 when the target temperature is input at the first timing, that is, when the target temperature of the first timing is changed in the form of a triangle. That is, when the timing of the input of the target temperature is delayed, its response waveform is also delayed, but the reference time point t=t0 and the elapsed time points t=t1 to tm are not delayed and fixed at the first timing. Thus, the interference matrix is calculated from the response waveform delayed with respect to the fixed elapsed time points t=t1 to tm.

Each row of the interference matrix A shown in FIG. 20 corresponds to each of the elapsed time points t=t1, t2, t3, ... tm from the reference time point t=t0 of the input of the target temperature at the first timing in the response waveform in FIG. 22-(b), respectively. For example, the matrixes $A_{11}$ to $A_{1n}$ on the uppermost first row show the relation at the elapsed time point t=t1, the matrixes $A_{21}$ to $A_{2n}$ of the next row show the relation at the elapsed time point t=t2, and similarly, the matrixes $A_{m1}$ to $A_{mn}$ of the lowermost row shows the relation at the elapsed time point t=tm.

Each of the elapsed time points t=t1, t2, t3, . . . tm is previously determined so as to correspond to each time point when the variation is to be prevented while the variation in temperature of the test wafer CW shown in FIG. 10 is generated. At this time, the reference time point t=t0 when the target temperature is changed into a triangular form at the first timing is to correspond to a time point when the heat process is started for the wafer W on the hot plate 121.

Each column of the interference matrix A shown in FIG. 20 correspond to the plurality of triangular inputs of the target temperatures having a regular time difference. For example, the matrixes $A_{11}$ to $A_{m1}$ of the leftmost column show the relation with respect to the triangular inputs of the target temperatures at the first timing, which correspond to FIG. 22-(a). Furthermore, the matrixes $A_{12}$ to $A_{m2}$ of the next column show the relation with respect to the triangular inputs of the target temperatures at the second timing delayed a certain time. Similarly, the matrixes $A_{1n}$ to $A_{mn}$ of the rightmost column show the relation with respect to the triangular inputs of the target temperatures at the last n-th timing.

According to the triangular inputs of the target temperatures shown in FIG. 22-(a), the triangular waveform at the earlier timing is preferably overlapped with a part of the triangular waveform at the next timing so that at least the change in target temperature may become sequential. According to this embodiment, a time corresponding to ½ of a base of the triangular waveform is delayed. In addition, when the delay time is constant, the calculation process is simple, but the delay time is not necessarily constant.

As described above, according to the interference matrix A shown in FIG. 20, each row corresponds to each of the elapsed time points t1, t2, . . . , tm in the triangular response waveform, and each column corresponds to each input of the target temperature having a time difference. Thus, according to the matrix positioned at the intersection between the row and column, for example the matrix $A_{21}$, the triangular input of the target temperature is at the first timing since it is on the first column and it is at the elapsed time point t2 in the triangular response waveform since it is on the second row. Similarly, according to the matrix $A_{12}$, the triangular input of the target temperature is at the second timing since it is on the second column and it is at the elapsed time point t1 in the triangular response waveform since it is in the first row.

Thus, according to the interference matrix A shown in FIG. 20, since each row corresponds to each of the elapsed time points t1, t2, . . . , tm in the triangular response waveform, and each column corresponds to each input of the target temperature having a time difference, it is the interference matrix showing the temporal influence of the input of the target temperature and the triangular response waveform.

In addition, there are triangular inputs of the target temperatures of the first to p-th channels ch1 to chp every timing of the first to n-th timing, and there are triangular response waveforms at measurement points 1 to k for each input of the target temperature. However, in FIG. 22-(a), the input of the target temperature of each channel at each timing is representatively shown by one triangular waveform, and in FIG. 22-(b), a plurality of response waveforms corresponding to each channel and each measurement point are representatively shown by one response waveform.

Next, the special (positional) relation of the interference matrix A will be described with reference to FIG. 21. FIG. 21 representatively shows the matrix $A_{21}$ in the interference matrix A in FIG. 20.

As described above, since the matrix $A_{21}$ is positioned on the first column and second row of the interference matrix A, the triangular input of the target temperature is at the first timing and corresponds to the elapsed time point t2 of the triangular response waveform.

As shown in FIG. 21, according to the matrix $A_{21}$, each column corresponds to each of the first to p-th channels ch1 to chp, and each row corresponds to each of the first to k-th measurement points s1 to sk.

Figure 23:
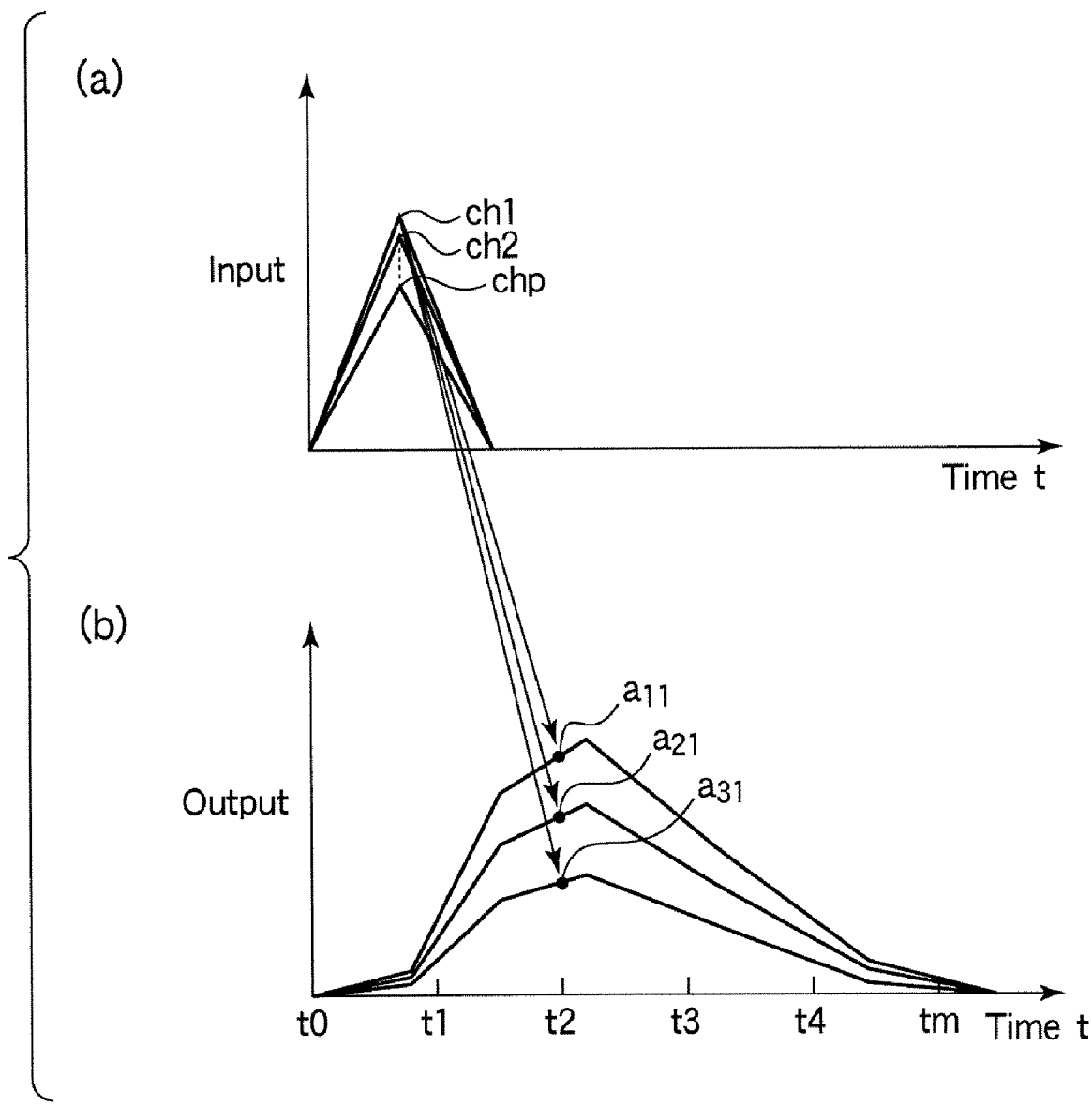
FIG. 23 is a view showing an input of a target temperature and an output as its response waveform.

For example, the temperature change "$a_{11}$" on the leftmost first column and the uppermost first row is the temperature change at the elapsed time point t2 at the first measurement point s1 in the triangular response waveform shown in FIG. 23-(b) with respect to the triangular input of the target temperature at the first ch1 at the first timing as shown in FIG. 23-(a). The temperature change "$a_{21}$" on the first column and second row is the temperature change at the elapsed time point t2 at the second measurement point s2 in the triangular response waveform with respect to the triangular input of the target temperature at the first ch1. Similarly, the temperature change "$a_{k1}$" on the first column and lowermost row is the temperature change at the elapsed time point t2 at the k-th measurement point sk in the triangular response waveform with respect to the triangular input of the target temperature at the first channel. In addition, three triangular response waveforms of the measurement point s1 to s3 are representatively shown in FIG. 23-(b) and the inputs of the temperatures at the first timing are shown in FIG. 23-(a). Although triangular waveforms of the channels except for the first channel ch1 are low so that they can be easily recognized, the triangular waveform at each channel has the same height actually.

In addition, according to the matrix $A_{21}$, the temperature change "$a_{12}$" in the second column and first row is the temperature change at the elapsed time point t2 in the triangular response waveform at the first measurement point s1 with respect to the triangular input of the target temperature at the second channel ch2. The temperature change "$a_{22}$" in the second column and second row is the temperature change at the elapsed time point t2 in the triangular response waveform at the second measurement point s2 with respect to the triangular input of the target temperature at the second channel ch2. Similarly, the temperature change "$a_{k2}$" on the second column and lowermost row is the temperature change at the elapsed time point t2 in the triangular response waveform at the k-th measurement point sk with respect to the triangular input of the target temperature at the second channel ch2.

Similarly, the temperature change "$a_{1p}$" on the rightmost column "p" and first row is the temperature change at the elapsed time point t2 in the triangular response waveform at the first measurement point s1 with respect to the triangular input of the target temperature at the p-th channel chp. The temperature change "$a_{2p}$" on the column "p" and second row is the temperature change at the elapsed time point t2 in the triangular response waveform at the second measurement point s2 with respect to the triangular input of the target temperature at the p-th channel chp. Similarly, the temperature change "$a_{kp}$" on the "p" column and lowermost row is the temperature change at the elapsed time point t2 in the triangular response waveform at the k-th measurement point sk with respect to the triangular input of the target temperature at the p-th channel chp.

Thus, since each row corresponds to each of the measurement points s1 to sk in the response waveform and each column corresponds to each of the channels ch1 to chp in the matrix $A_{21}$, it is the interference matrix showing an influence of the special position such as the position in the test wafer CW and arrangement of the heaters and the temperature sensors corresponding to the channels ch1 to chp. This is not limited to the matrix $A_{21}$ and applied to the matrix constituting the interference matrix shown in FIG. 20.

Therefore, the interference matrix A shown in FIG. 20 and in detail in FIG. 19 is the matrix provided in view of the temporal and special influences.

The interference matrix A used in this embodiment has been described above, and the personal computer 154 shown in FIG. 11 calculates the interference matrix A by the calculation operation from the stepped response waveform measured as described above and stores it in a file for the interference matrix, for example.

Furthermore, the personal computer 154 measures data of the measured temperature at the plurality of measurement points 1 to k of the wafer W when the heat process shown in FIG. 10 is performed using the test wafer CW, and stores it in a data file. That is, in a state before the target temperature is adjusted according to this embodiment, the temperatures at the plurality of measurement points 1 to k of the wafer W are measured when the heat process of the wafer W is performed and stored in the data file.

The personal computer 154 calculates the adjustment value as the adjustment information for adjusting the target temperature to prevent the variation, based on the interference matrix A and the measured data of the temperatures at the plurality of measurement points 1 to k of the test wafer CW as follows.

It is assumed that the triangular temperature change of the target temperature (height of the triangular waveform) of the channels ch1 to chp at the first to the n-th timings are $C_1$ to $C_n$, and the temperature change at the measurement points 1 to k at the elapsed time points t1 to tm of the wafer W are $b_1$ to $b_m$. In this case, the temperature change $b_1$ to $b_m$ at the measurement points 1 to k at the elapsed time points t1 to tm of the wafer W can be shown by the following formula with the interference matrix A.

[Formula (1)]

$$\begin{bmatrix} b_1 \\ b_2 \\ \vdots \\ b_m \end{bmatrix} = \begin{bmatrix} A_{11} & A_{12} & \ldots & A_{1n} \\ A_{21} & A_{22} & \ldots & A_{2n} \\ \vdots & \vdots & & \vdots \\ A_{m1} & A_{m2} & \ldots & A_{mn} \end{bmatrix} \begin{bmatrix} c_1 \\ c_2 \\ \vdots \\ c_n \end{bmatrix} \quad (1)$$

In the above formula, $b_1$ designates a vector showing a temperature change at each of the measurement points 1 to k at the elapsed time point t=t1, b2 designates a vector showing a temperature change at each of the measurement points 1 to k at the elapsed time point t=t2, and similarly, $b_m$ designates a vector showing a temperature change at each of the measurement points 1 to k at the elapsed time point t=tm.

In addition, $C_1$ designates a vector showing a triangular temperature change of the target temperature (height of the temperature) at each of the channels ch1 to chp at the first timing, $C_2$ designates a vector showing a triangular temperature change of the target temperature (height of the temperature) at each of the channels ch1 to chp at the second timing, and similarly, $C_n$ designates a vector showing a temperature change of the target temperature (height of the temperature) at each of the channels ch1 to chp at the n-th timing.

This formula (1) shows the temperature changes $b_1$ to $b_m$ of each of the measurement points 1 to k of the wafer W at each of the elapsed time points t=t1 to tm with respect to the temperature changes $C_1$ to $C_n$ of the target temperatures at each of the first to n-th timings.

That is, according to the formula (1), where the height of the triangle of the temperature of the target temperature at each of the first to the n-th timings are $C_1$ to $C_n$, the temperature change at the measurement point of the wafer W at each of the elapsed time points t=t1 to tm are $b_1$ to $b_m$.

Therefore, reversely, where the temperature changes $b_1$ to $b_m$ at the measurement point of the wafer W at the elapsed time points t=t1 to tm are selected so as to prevent the variation, the temperature change of the target temperature required to generate such temperature change (height of the temperature) $C_1$ to $C_n$, that is, the adjustment values $C_1$ to $C_n$ can be calculated by the following formula by use of an inverse matrix $A^{-1}$ of the interference matrix A.

[Formula (2)]

$$\begin{bmatrix} c_1 \\ c_2 \\ \vdots \\ c_n \end{bmatrix} = \begin{bmatrix} A_{11} & A_{12} & \ldots & A_{1n} \\ A_{21} & A_{22} & \ldots & A_{2n} \\ \vdots & \vdots & & \vdots \\ A_{m1} & A_{m2} & \ldots & A_{mn} \end{bmatrix}^{-1} \begin{bmatrix} b_1 \\ b_2 \\ \vdots \\ b_m \end{bmatrix} \quad (2)$$

Where the inverse matrix $A^{-1}$ of the interference measurement points 1 to k of the wafer W is greater than the number of controllable channels ch1 to chp in general, it is difficult to find the inverse matrix $A^{-1}$. Therefore, according to this embodiment, instead of the inverse matrix $A^{-1}$, a pseudo-inverse matrix $(A^T * A)^{-1} * A^T$ is used. In addition, $A^T$ is a transposed matrix of the interference matrix A.

The personal computer 154 calculates a temperature change that can prevent the variation, as temperature distribution information, from the data of the measured temperatures at the plurality of measurement points 1 to k of the wafer W when the heat process shown in FIG. 10 is performed.

For example, referring to FIG. 10, where the measured temperature $b_{11}$ at the measurement point 1 at the elapsed time point t=t1 is higher than the average value by 0.08° C., −0.08° C. is provided to prevent the variation as the temperature distribution information at the measurement point 1 at the elapsed time point t=t1. Where the measured temperature $b_{21}$ at the measurement point 2 at the elapsed time point t=t1 is lower than the average value by 0.04° C., +0.04° C. is provided to prevent the variation as the temperature distribution information at the measurement point 2 at the elapsed time point t=t1. Where the measured temperature $b_{31}$ at the measurement point 3 at the elapsed time point t=t1 is lower than the average value by 0.08° C., +0.08° C. is provided to prevent the variation as the temperature distribution information at the measurement point 3 at the elapsed time point t=t1. In this way, the temperature distribution information until the measurement point k at the elapsed time point t=t1 is calculated. Furthermore, in this way, the temperature distribution information of the measurement points 1 to k at the elapsed time points t2 to tm is calculated.

The calculated temperature distribution information at the elapsed time points t=t1 to tm to prevent the variation in temperature is used as the $b_1$ to $b_m$ in the above formula (2).

The personal computer 154 calculates the adjustment values $C_1$ to $C_n$ of the target temperature from the extracted temperature distribution information $b_1$ to $b_m$ and the pseudo-inverse matrix $(A^T * A)^{-1} * A^T$ used instead of the inverse $A^{-1}$ of the interference matrix A according to the formula (2).

The adjustment values $C_1$ to $C_n$ are vectors of plus or minus temperature values with respect to the predetermined temperature T that is the target temperature to perform the heat process of the wafer W by the hot plate 121. When these adjustment values $C_1$ to $C_n$ (referred to as the "C" hereinafter) are added to the target temperature as addition values of the target temperature, the target temperature can be adjusted.

Since the adjustment value C is calculated by use of not the inverse matrix $A^{-1}$ of the interference matrix A, but the pseudo-inverse matrix $(A^T * A)^{-1} * A^T$ that is based on the interference matrix A, an error is generated. However, where it is determined that the effect of preventing the variation in temperature can be sufficiently provided by the calculated adjustment value C, the adjustment value C may be used.

According to this embodiment, the calculated adjustment value C is set to an initial value and an initial group is formed with it and initial values of the adjustment values randomly generated. Then, an optimal value of the adjustment value C is searched for by a genetic algorithm using an evaluation formula including the interference matrix A in order to further enhance the effect of preventing the variation in temperature.

Here, the following formula is used as the evaluation formula.

$$b' = b - AC$$

In the above formula, A is the above interference matrix, C is the adjustment value, and b is the vector of the temperature distribution information calculated to prevent the variation in temperature, which corresponds to the above $b_1$ to $b_m$.

As shown in the above formula (1), where the adjustment value C can be calculated by use of the inverse matrix $A^{-1}$, b is equal to AC and the evaluation value b' becomes 0. However, according to this embodiment, the adjustment value C is calculated by use of the pseudo-inverse matrix $(A^T*A)^{-1}*A^T$, instead of the inverse matrix $A^{-1}$, the evaluation value b' does not become 0.

Thus, according to this embodiment, the adjustment value C that has a small variation width, that is, a minimum difference between the maximum value and the minimum value of the evaluation value b', is searched for and determined as a final adjustment value C.

Specifically, for example, the initial group of 100 adjustment values comprising the adjustment value C calculated by use of the pseudo-inverse matrix as described above and the randomly generated adjustment values, as the initial values, is prepared, and the adjustment value b' is calculated by the above evaluation formula for each adjustment value. Further, a first operation for calculating a maximum variation width that is the difference between the maximum value and the minimum value of the evaluation value b' is performed. A second operation for selecting adjustment values from values having a small variation width and thus being favorable is performed. A third operation for increasing the number of adjustment values to 100 by generating crossing and mutation in the selected adjustment values is performed. Then, these first, second and third operations are set as one generation and similarly repeated. In this repetition, when the variation width of the evaluation value b' calculated in the first operation becomes close to 0, the process is stopped and the adjustment value C having a variation width of the smallest difference in the generation is selected as the final adjustment value C.

The personal computer 154 transmits the adjustment value C of the target temperature determined as described above to the temperature controller 150 through the network.

Figure 24:
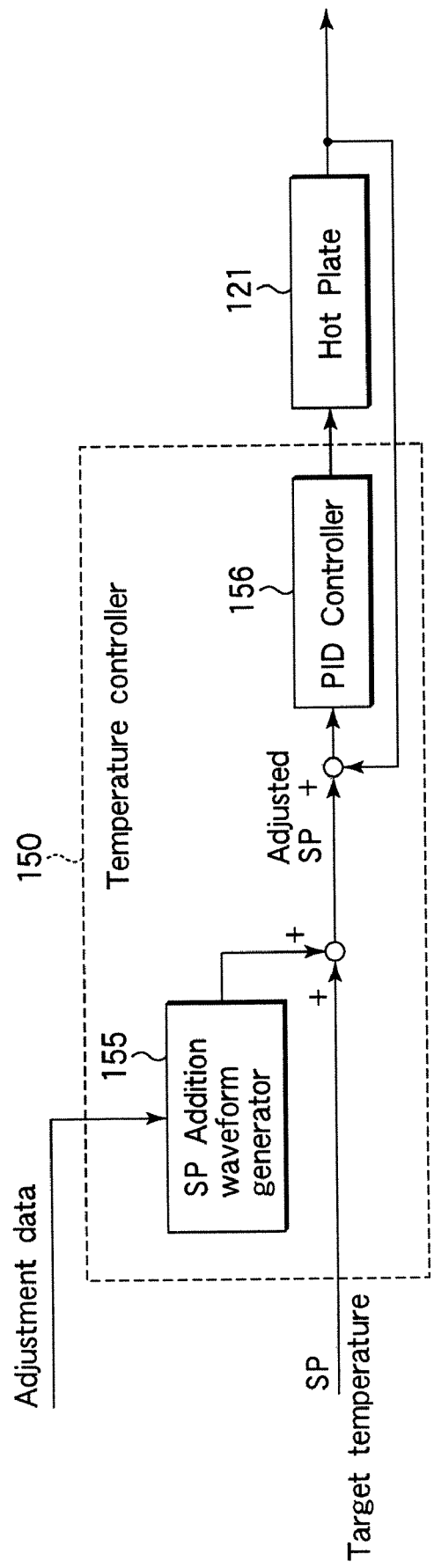
FIG. 24 is a block diagram showing a temperature controller.

FIG. 24 shows a block diagram of an inner constitution of the temperature controller 150. An SP addition waveform generator 155 is disposed to generate an addition waveform added to the target temperature SP of the predetermined temperature T based on the adjustment data containing the adjustment value C transmitted from the personal computer 154. A PID controller 156 is disposed to perform a PID calculation and output the operation amount, in accordance with the deviation between the adjusted target temperature to which the addition waveform is added and the detected temperature PV from the hot plate 121. The SP addition waveform generator 155 and the PID controller 156 are constituted by a microcomputer.

Figure 25:
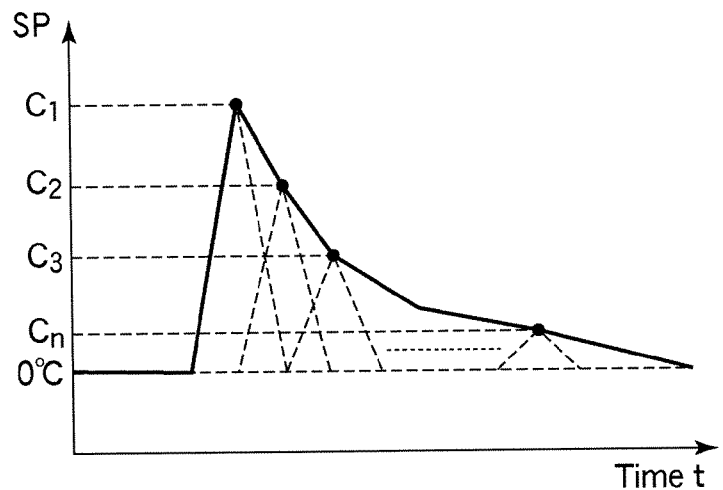
FIG. 25 is a view showing an example of an addition waveform of the target temperature.

FIG. 25 shows an example of the addition waveform of one channel. The adjustment value C ($C_1$ to $C_n$) corresponding to the height of the triangular waveform at the first to the n-th timings is transmitted from the personal computer 154 to the SP addition waveform generator 155 so as to be related to each channel. The SP addition waveform generator 155 generates the addition waveform connecting apexes of the triangular waveform. At this time, a start time point of generation of the SP addition waveform is the start time point of the heat process of the test wafer CW on the hot plate 121, for example, and it corresponds to the above reference time point t=t0. A time point when the test wafer CW is mounted on the hot plate 121 can be detected by a timing signal (not shown) from the central control section 19 that controls the main wafer transfer unit 16 or 17 to perform loading of the test wafer CW onto the hot plate 121, or detected from a change in detected temperature of the hot plate 121, for example.

In the normal heat process of a wafer W, the temperature controller 150 adds the addition waveform to the target temperature SP set to the predetermined temperature T to provide an inner target temperature. Then, the temperature controller 150 controls the detected temperature PV of the hot plate 121 so that it conforms to the inner target temperature.

Figure 26:
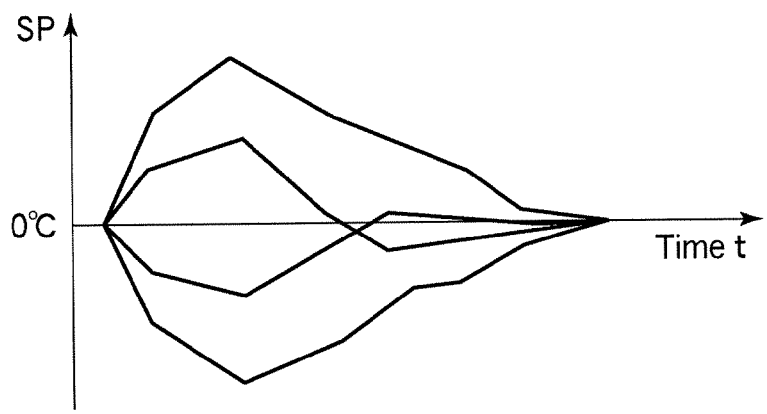
FIG. 26 is a view showing an addition waveform of the target temperature of each channel.
Figure 27:
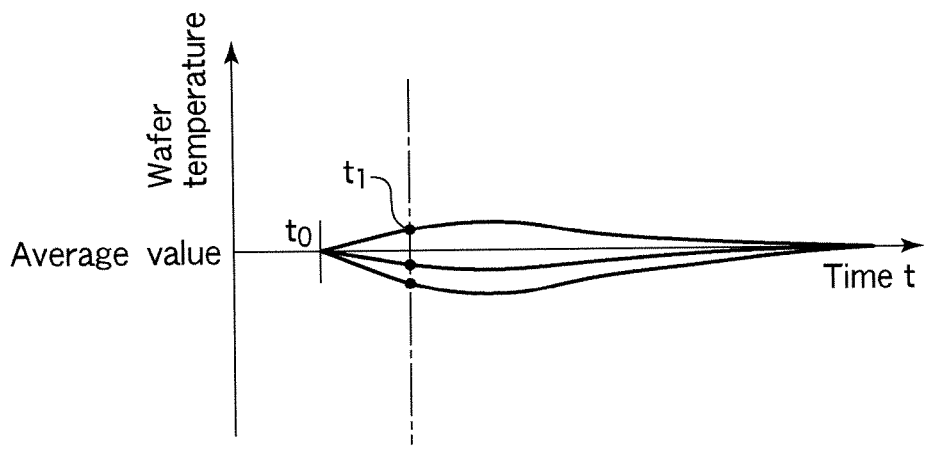
FIG. 27 is a view showing a measured temperature of each measurement point of the wafer in which the variation is decreased.

Therefore, when the addition waveform shown in FIG. 26 is added to the target temperature of each channel to adjust the target temperature, the variation in temperature of a wafer W shown in FIG. 10, for example, is decreased as shown in FIG. 27, so that a uniform heat process can be performed.

Next, an explanation will be given of a sequential flow that includes creation of hot plate characteristics in accordance with the model described above, temperature control based on the characteristics, and an actual process by use of controlled temperature.

Figure 28:
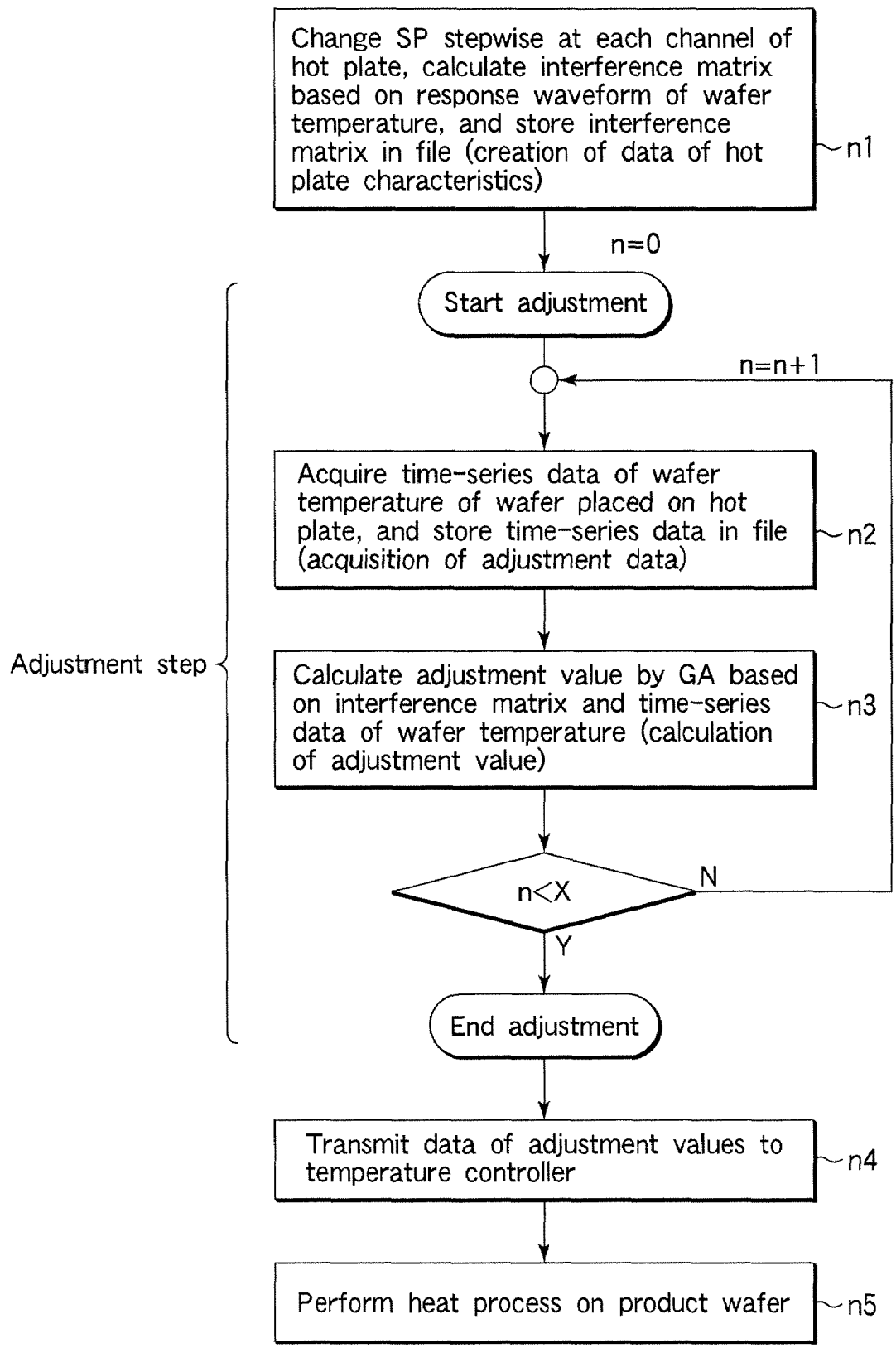
FIG. 28 is a flow chart for explaining a sequential flow that includes creation of hot plate characteristics, temperature control based on the characteristics, and an actual process by use of controlled temperature, according to an embodiment of the present invention.

FIG. 28 is a flow chart for explaining a flow of this kind performed by the personal computer 154.

First, a response waveform is measured at each of the measurement points 1 to k of the test wafer CW while the target temperature is changed stepwise with respect to each of the channels ch1 to chp of the hot plate 121, and the interference matrix A is calculated from the response waveforms by a calculating operation (first procedure) and stored in a file (Step n1). This model is a matrix type model showing wafer responses relative to changes in set temperature, i.e., showing hot plate characteristics. In other words, data of hot plate characteristics is created in Step n1.

Then, an adjustment step is performed.

Specifically, the test wafer CW is first placed on the hot plate 121 that is stabilized at a target temperature, and a heat process is performed, so that time-series data of the measured temperatures at the measurement points 1 to k of the test wafer CW is acquired as adjustment data and stored in a file (Step n2).

The time-series data as adjustment data is used to extract temperature distribution information for preventing the variation in temperature. Then, based on the interference matrix, which is the characteristics data of the hot plate, and the temperature distribution information, an adjustment value of the target temperature is calculated (second procedure), and an adjustment parameter is calculated by use of the genetic algorithm (GA) (Step n3).

Figure 29:
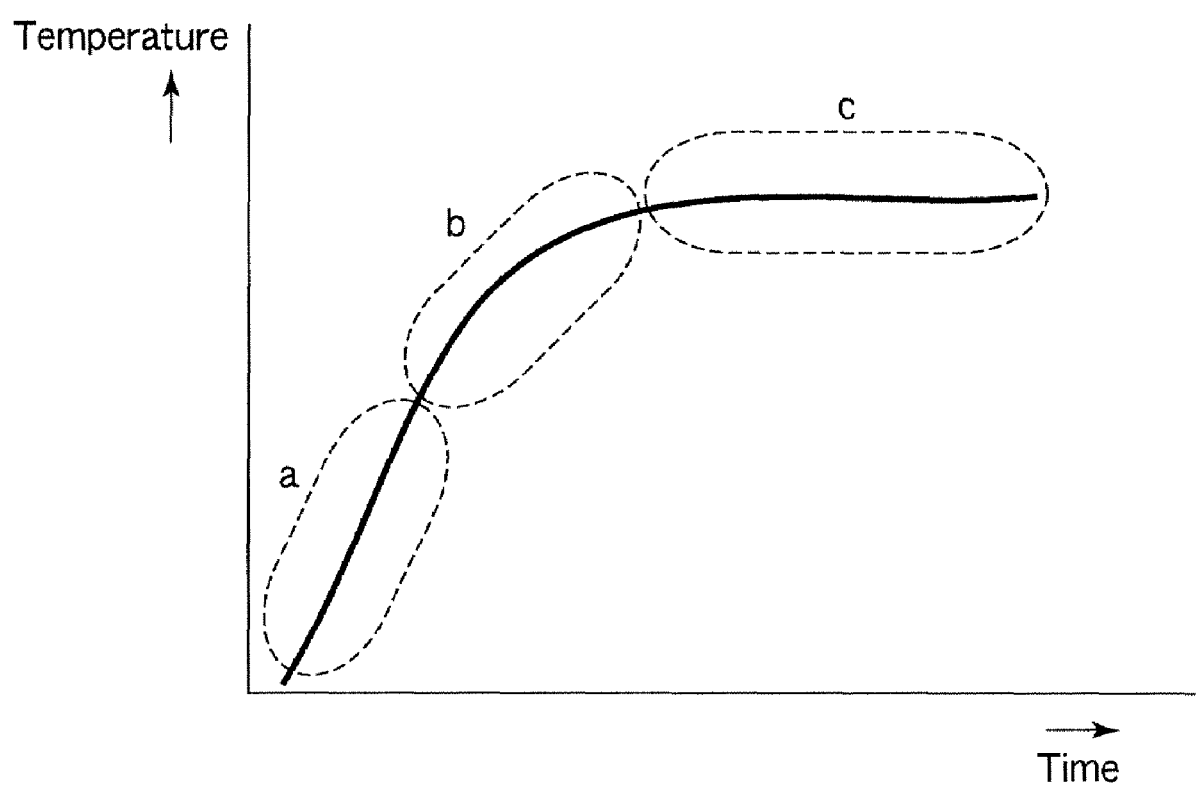
FIG. 29 is a schematic view showing an example of adjustment areas for respective times, where an adjustment step of adjusting a temperature profile is performed a plurality of times.

In this case, since the temperature profile of the hot plate typically renders a curve as shown in FIG. 29, it is not necessarily easy to adjust it to a desired profile by one adjustment operation. In order to acquire a high-precision adjustment value, the adjustment step preferably repeated a plurality of times. The adjustment step is ideally repeated until the adjustment value converges, but this prolongs the operation with an undetermined adjustment time. Thus it is preferable to repeat the adjustment step a determined number of times.

Specifically, for example, the adjustment step is repeated three times such that the area "a" of the temperature profile shown in FIG. 29 is first adjusted, then the area "b" is adjusted, and then the area "c" is adjusted.

Further, in this adjustment step, it is preferable to also perform adjustment of the recovery, i.e., adjustment of the arrival time to the heating temperature of the wafer W or target temperature. In this case, the adjustment is performed in the apparatus shown in FIG. 11, such that a heat process is first performed under unadjusted conditions and the temperature of the test wafer CW is measured. Then, a before-adjustment temperature-increase time is calculated, and the difference $\Delta t$ between this temperature-increase time and the target temperature-increase time is calculated. Then, by use of a relation formula $b=f(\Delta t)$ acquired in advance, an adjustment value "b" is calculated. Further, at this time, a variation of the power supply voltage may be adjusted.

When the temperature profile adjustment (transient adjustment) descried above is performed, the test wafer CW is loaded into the heat processing unit (CHP). However, at the initial stage, the casing is not yet sufficiently heated, and the acquired data may be less reliable. Accordingly, the sequence is preferably arranged to perform a loading operation of the test wafer CW one time or a plurality of times prior to the temperature profile adjustment (transient adjustment). Then, the adjustment can be reliable performed under a state with high temperature stability.

When this operation for temperature stabilization is performed, it is preferable to perform offset adjustment, i.e., adjustment of the set temperature for heating the wafer. In this offset adjustment, the average temperature is adjusted at a predetermined elapsed time point after the wafer is placed on the hot plate. This makes it possible to smoothly perform the subsequent temperature profile adjustment in a short time.

Figure 30:
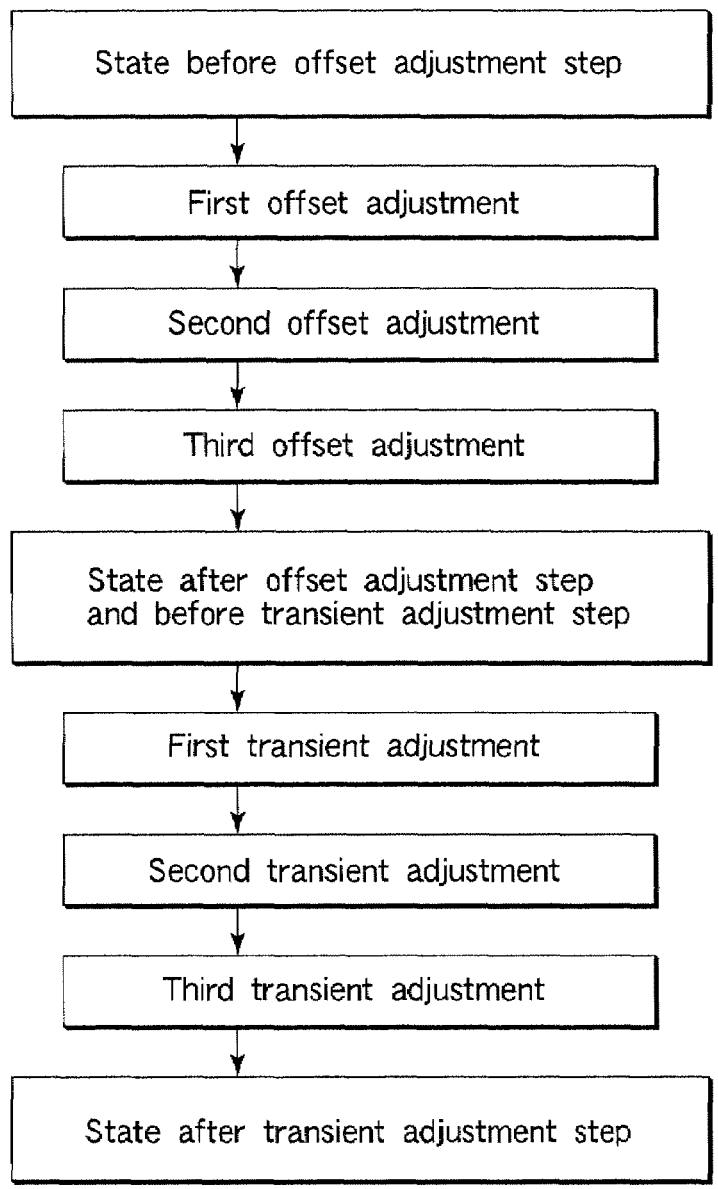
FIG. 30 is a view for explaining an example of an actual adjustment step.

FIG. 30 is a view for explaining an example of an actual adjustment step.

Specifically, from a state before the offset adjustment step, offset adjustment used also for temperature stabilization is repeated three times, and then the temperature profile adjustment (transient adjustment) is repeated three times on the wafer surface, as described in Steps n2 and n3.

Then, data of adjustment values thus determined by the adjustment step described above is transmitted to the temperature controller 150 (Step n4).

Figure 31:
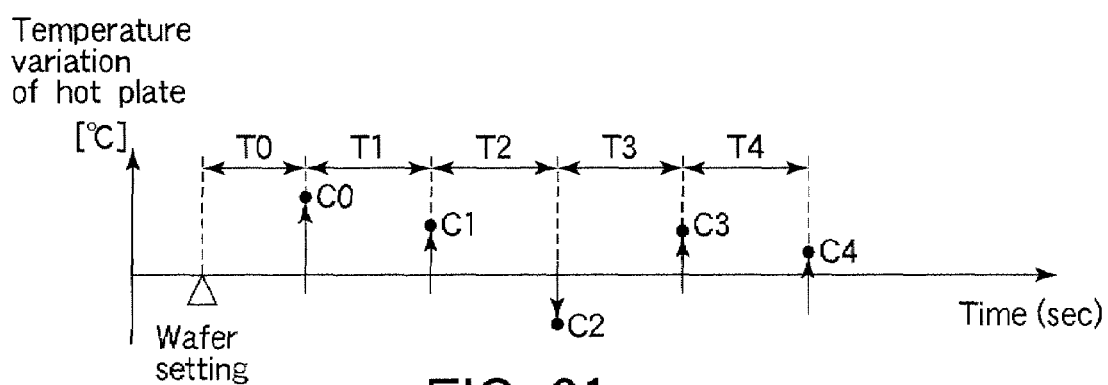
FIG. 31 is a view for explaining a temperature control method used in an actual process.

Based on the adjustment values, the target temperatures of the temperature controller 150 are adjusted, and the heat process is performed on a product wafer (Step n5). In the heat process of the product wafer, as shown in FIG. 31, the presence of the wafer is detected at each channel, and control is performed in accordance with a time constant (a constant that defines temperature change time Tn of the hot plate) and a gain (a constant that defines temperature change amount Cn of the hot plate at a time Tn).

With the temperature control method according to this embodiment, the temperature uniformity on the wafer surface is greatly improved, in the process including the transient period before arrival to the set temperature. Further, since the temperature of the hot plate in each heat processing unit is controlled based on the temperature of the test wafer CW, the individual difference between heat processing units is less influential.

Next, an explanation will be given of an effect acquired in a case where a temperature control method according to the embodiment of the present invention is actually adopted.

Figure 32:
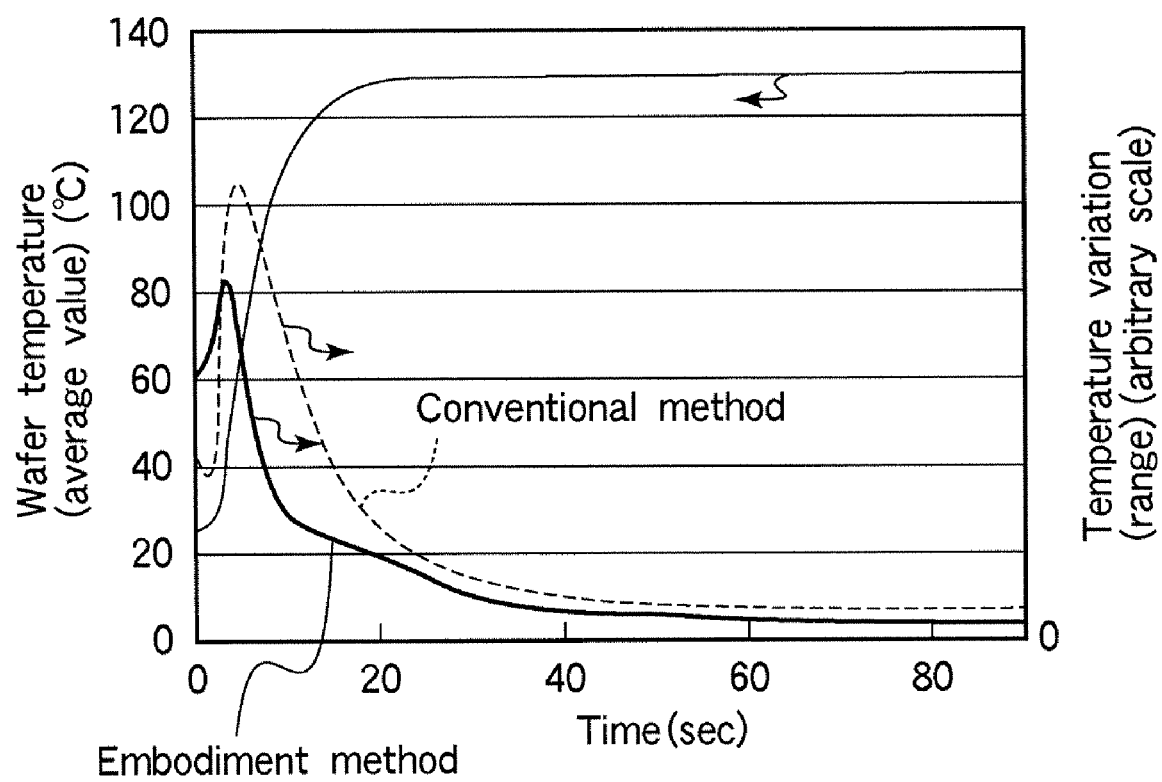
FIG. 32 is a view for explaining an effect according to an embodiment of the present invention.

FIG. 32 is a view showing a wafer temperature profile (average value) and temperature uniformity (variation), for comparison between a conventional method and a method according to the embodiment of the present invention. As shown in FIG. 32, as compared to the conventional method, the method according to the embodiment decreased the variation in temperature by about 30% during the transient period before arrival of the wafer temperature to the set temperature (steady temperature).

Where the time point t=t0 to tm for suppressing the variation in temperature of a wafer is changed, a change in the time point t=t0 to tm is input into the computer 154. Then, the computer 154 calculates an interference matrix A corresponding to the changed time point, as well as temperature distribution information, so as to calculate an adjustment value based thereon.

According to the embodiment described above, a stepped response waveform of measured temperatures of a substrate at a plurality of measurement points is measured when each target temperature is changed stepwise. Then, the measured stepped response waveform is used to compose a pulsed response waveform with respect to a change of a pulsed target temperature. Then, the pulsed response waveform is used to acquire relation information showing a relation between the target temperatures and temperatures of the substrate at the plurality of measurement points. Further, measured temperatures of a substrate, measured at the plurality of measurement points before adjustment of the target temperatures, are used to acquire temperature distribution information. Then, the relation information and the temperature distribution information are used to calculate and determine adjustment information. Then, the adjustment information is used to adjust the target temperatures. Consequently, the temperature state of a hot plate is controlled in accordance with the adjusted target temperatures, whereby the temperature of the substrate processed on the hot plate becomes a desired state.

The present invention is not limited to the embodiment described above, and it may be modified in various manners. For example, the embodiment described above is arranged to search for an optimal adjustment value by use of a genetic algorithm. However, any searching method may be used, such as a hill-climbing search, a simulated annealing (SA) method, or a full search of thoroughly searching a possible range.

In the embodiment described above, the temperature control is applied to a heat process using a heater to heat a hot plate. Alternatively, the temperature control may be applied to a case using a thermoelectric element, such as a peltiert device, or a case using both of heating and cooling.

In the embodiment described above, the temperature controller 150 has no calculation function, while the personal computer 154 has a calculation function. However, the temperature controller 150 may have a calculation function.

In the embodiment described above, the target substrate is exemplified by a semiconductor wafer, but the present invention may be applied to another substrate, such as a glass substrate for liquid crystal display devices (LCD).

The present invention is effectively applicable to the temperature control of a heat processing unit used in a resist coating/developing system for a substrate, such as a semiconductor wafer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A temperature control method for controlling a temperature of a hot plate, so that respective measured temperatures of the hot plate at a plurality of measurement points conform to respective target temperatures, in a heat processing apparatus for performing a heat process on a substrate placed on the hot plate, which is used in a coating/developing system for applying a resist coating onto the substrate to form a resist film and then performing development on the resist film after light exposure, the method comprising:

a first step of measuring a stepped response waveform of measured temperatures of a substrate at the plurality of measurement points while changing stepwise each target temperature, then using the measured stepped response waveform to compose a pulsed response waveform with respect to a change of a pulsed target temperature, then using the pulsed response waveform to compose a triangular response waveform with respect to a change of a triangular target temperature, and then using the triangular response waveform to acquire a matrix as relation information showing a relation between the target temperatures and temperatures of the substrate at the plurality of measurement points;

a second step of acquiring temperature distribution information by use of measured temperatures of the substrate placed on the hot plate, measured at the plurality of measurement points before adjustment of the target temperatures, and then calculating adjustment information by use of the relation information acquired in the first step and the temperature distribution information; and a third step of adjusting the target temperatures by use of the adjustment information acquired in the second step, wherein the second step is arranged to perform an offset adjustment of set temperature for heating the substrate, while performing one time or a plurality of times a temperature stabilization operation of placing a substrate on the hot plate and stabilizing temperature thereof, prior to an operation for calculating adjustment information, the second step is arranged to determine the adjustment information by repeating a plurality of times an operation for acquiring the temperature distribution information and an operation for calculating adjustment information by use of the relation information acquired in the first step and the temperature distribution information, and the second step is arranged to perform the operation for calculating adjustment information a plurality of times respectively at different time points corresponding to different temperature ranges.

2. The temperature control method according to claim 1, wherein the first step is arranged to compose a plurality of temporally different pulsed response waveforms.

3. The temperature control method according to claim 2, wherein the adjustment information comprises an adjustment value at a preset time point for each of the plurality of target temperatures, and the second step is arranged to calculate the adjustment value by use of an inverse matrix of the matrix and the temperature distribution information.

4. The temperature control method according to claim 3, wherein the second step is arranged to randomly change at least the adjustment value and search for an optimal value of the adjustment value by a searching method using an evaluation formula including the matrix.

5. An adjusting apparatus for acquiring adjustment information used for a temperature controller configured to control a temperature of a hot plate, so that respective measured temperatures of the hot plate at a plurality of measurement points conform to respective target temperatures, and to adjust the respective target temperatures by use of the adjustment information, in a heat processing apparatus for performing a heat process on a substrate placed on the hot plate, which is used in a coating/developing system for applying a resist coating onto the substrate to form a resist film and then performing development on the resist film after light exposure, the adjusting apparatus comprising:

a calculating device configured to calculate the adjustment information for adjusting temperature of a substrate to a desired temperature state, by use of relation information showing a relation between the target temperatures and temperatures of the substrate and temperature distribution information of the substrate measured before adjustment of the target temperatures, wherein the calculating device comprises a first calculating portion for measuring a stepped response waveform of measured temperatures of the substrate at the plurality of measurement points while changing stepwise each target temperature, then using the measured stepped response waveform to compose a pulsed response waveform with respect to a change of a pulsed target temperature, then using the pulsed response waveform to compose a triangular response waveform with respect to a change of a triangular target temperature, and then using the triangular response waveform to acquire a matrix as relation information showing a relation between the target temperatures and temperatures of the substrate at the plurality of measurement points, and a second calculating portion for calculating the temperature distribution information by use of measured temperatures of the substrate measured at the plurality of measurement points before adjustment of the target temperatures, wherein the second calculating portion is arranged to perform an offset adjustment of set temperature for heating the substrate, while performing one time or a plurality of times a temperature stabilization operation placing a substrate on the hot plate and stabilizing temperature thereof, prior to an operation for calculating adjustment information, the second calculating portion is arranged to determine the adjustment information by repeating a plurality of times an operation for acquiring the temperature distribution information and an operation for calculating adjustment information by use of the relation information acquired in the first calculating portion and the temperature distribution information, and the second calculating portion is arranged to perform the operation for calculating adjustment information a plurality of times respectively at different time points corresponding to different temperature ranges.

6. The adjusting apparatus according to claim 5, wherein the first calculating portion is arranged to compose a plurality of temporally different pulsed response waveforms.

7. The adjusting apparatus according to claim 6, wherein the adjustment information comprises an adjustment value at a preset time point for each of the plurality of target temperatures, and the calculating device is arranged to calculate the adjustment value by use of an inverse matrix of the matrix and the temperature distribution information.

8. The adjusting apparatus according to claim 7, wherein the calculating device is arranged to randomly change at least the adjustment value and search for an optimal value of the adjustment value by a searching method using an evaluation formula including the matrix.

9. The adjusting apparatus according to claim 5, wherein the desired temperature state is a state in which a variation in measured temperatures of the substrate at the plurality of measurement points is decreased.

10. The adjusting apparatus according to claim 5, wherein the temperature controller is configured to control temperature by use of deviation between each target temperature and detected temperature, and adjust at least one of each target temperature and detected temperature in accordance with the adjustment information.

11. A temperature controller for controlling a temperature of a hot plate, so that respective measured temperatures of the hot plate at a plurality of measurement points conform to respective target temperatures, in a heat processing apparatus for performing a heat process on a substrate placed on the hot plate, which is used in a coating/developing system for applying a resist coating onto the substrate to form a resist film and then performing development on the resist film after light exposure, the temperature controller comprising:

a calculating device configured to calcuate adjustment information for adjusting temperature of a substrate to a desired temperature state, by use of relation information showing a relation between the target temperatures and temperatures of the substrate, wherein the calculating device comprises a first calculating portion for measuring a stepped response waveform of measured temperatures of the substrate at the plurality of measurement points while changing stepwise each target temperature, then using the measured stepped response waveform to compose a pulsed response waveform with respect to a change of a pulsed target temperature, then using the pulsed response waveform to compose a triangular response waveform with respect to a change of a triangular target temperature, and then using the triangular response waveform to acquire a matrix as relation information showing a relation between the target temperatures and temperatures of the substrate at the plurality of measurement points, and a second calculating portion for calculating the temperature distribution information by use of measured temperatures of the substrate measured at the plurality of measurement points before adjustment of the target temperatures, wherein the second calculating portion is arranged to perform an offset adjustment of set temperature for heating the substrate, while performing one time or a plurality of times a temperature stabilization operation of placing a substrate on the hot plate and stabilizing temperature thereof, prior to an operation for calculating adjustment information, the second calculating portion is arranged to determine the adjustment information by repeating a plurality of times an operation for acquiring the temperature distribution information and an operation for calculating adjustment information by use of the relation information acquired in the first calculating portion and the temperature distribution information, and the second calculating portion is arranged to perform the operation for calculating adjustment information a plurality of times respectively at different time points corresponding to different temperature ranges.

12. The temperature controller according to claim 11, wherein the calculating device is configured to calculate the adjustment information, by use of the relation information and temperature distribution information of the substrate measured before adjustment of the target temperatures.

13. A heat processing apparatus for performing a heat process on a substrate, which is used in a coating/developing system for applying a resist coating onto the substrate to form a resist film and then performing development on the resist film after light exposure, the heat processing apparatus comprising:

a hot plate configured to heat a substrate placed thereon, the temperature controller according to claim 11, an operating device configured to heat the hot plate in accordance with an output of the temperature controller, and a temperature detecting device configured to detect temperature of the hot plate at a plurality of detection points.

14. A computer readable storage medium that stores a program for execution on a computer, for acquiring adjustment information used for a temperature controller configured to control a temperature of a hot plate, so that respective measured temperatures of the hot plate at a plurality of measurement points conform to respective target temperatures, and to adjust the respective target temperatures by use of the adjustment information, in a heat processing apparatus for performing a heat process on a substrate placed on the hot plate, which is used in a coating/developing system for applying a resist coating onto the substrate to form a resist film and then performing development on the resist film after light exposure, wherein the program causes the computer to execute:

a first procedure of using a stepped response waveform of measured temperatures of a substrate, measured at the plurality of measurement points while changing stepwise each target temperature, to compose a pulsed response waveform with respect to a change of a pulsed target temperature, then using the pulsed response waveform to compose a triangular response waveform with respect to a change of a triangular target temperature, and then using the triangular response waveform to acquire a matrix as relation information showing a relation between the target temperatures and temperatures of the substrate at the plurality of measurement points, and a second procedure of calculating temperature distribution information by use of measured temperatures of the substrate measured at the plurality of measurement points before adjustment of the target temperatures, and then calculating adjustment information for adjusting temperature of the substrate to a desired temperature state, by use of the relation information acquired in the first procedure and the temperature distribution information, wherein the second procedure is arranged to perform an offset adjustment of set temperature for heating the substrate, while performing one time or a plurality of times a temperature stabilization operation of placing a substrate on the hot plate and stabilizing temperature thereof, prior to an operation for calculating adjustment information, the second procedure is arranged to determine the adjustment information by repeating a plurality of times an operation for acquiring the temperature distribution information and an operation for calculating adjustment information by use of the relation information acquired in the first procedure and the temperature distribution information, and the second procedure is arranged to perform the operation for calculating adjustment information a plurality of times respectively at different time points corresponding to different temperature ranges.

15. The storage medium according to claim 14, wherein the first procedure is arranged to compose a plurality of temporally different pulsed response waveforms.

16. The storage medium according to claim 15, wherein the adjustment information comprises an adjustment value at a preset time point for each of the plurality of target temperatures, and the second procedure is arranged to calculate the adjustment value by use of an inverse matrix of the matrix and the temperature distribution information.

17. The storage medium according to claim 16, wherein the second procedure is arranged to randomly change at least the adjustment value and search for an optimal value of the adjustment value by a searching method using an evaluation formula including the matrix.

* * * * *